(12) United States Patent
Suzuki et al.

(10) Patent No.: US 8,426,303 B2
(45) Date of Patent: Apr. 23, 2013

(54) MANUFACTURING METHOD OF SEMICONDUCTOR DEVICE, AND MOUNTING STRUCTURE THEREOF

(75) Inventors: Zenzo Suzuki, Kanagawa (JP); Michitaka Kimura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 57 days.

(21) Appl. No.: 13/111,373

(22) Filed: May 19, 2011

(65) Prior Publication Data

US 2011/0291270 A1    Dec. 1, 2011

(30) Foreign Application Priority Data

May 27, 2010  (JP) ................................. 2010-121337

(51) Int. Cl.
*H01L 21/44* (2006.01)
(52) U.S. Cl.
USPC .......................................... 438/613; 438/614
(58) Field of Classification Search .......... 438/613–617, 438/E21.508
See application file for complete search history.

(56) References Cited

U.S. PATENT DOCUMENTS

| 5,937,320 | A  | * | 8/1999 | Andricacos et al. | .......... 438/614 |
| 6,586,323 | B1 | * | 7/2003 | Fan et al. | ....................... 438/614 |
| 7,456,090 | B2 | * | 11/2008 | Chang et al. | .................. 438/613 |
| 8,110,508 | B2 | * | 2/2012 | Kang et al. | ..................... 438/614 |
| 2008/0050905 | A1 | * | 2/2008 | Uchida et al. | ................. 438/614 |
| 2012/0098124 | A1 | * | 4/2012 | Wu et al. | ....................... 438/614 |
| 2012/0248605 | A1 | * | 10/2012 | Yamaguchi | .................. 438/613 |

FOREIGN PATENT DOCUMENTS

JP    2006-120803    5/2006

* cited by examiner

*Primary Examiner* — Cuong Q Nguyen
(74) *Attorney, Agent, or Firm* — McDermott Will & Emery LLP

(57) ABSTRACT

A semiconductor device with improved quality and reliability is provided. In a UBM formed over an electrode pad located over a semiconductor substrate, the edge (end) of an Au film as an upper layer is located inside or in the same position as the edge (end) of a TiW film as a lower layer, which can suppress the formation of a suspended part in the Au film. This arrangement can prevent the occurrence of electrical short circuit between the adjacent pads due to the suspended part and the adhesion of the suspended part as foreign matter to the semiconductor substrate, thus improving the quality and reliability of the semiconductor device (semiconductor chip).

10 Claims, 19 Drawing Sheets

2 : SEMICONDUCTOR CHIP (SEMICONDUCTOR DEVICE)
2c : ELECTRODE PAD (ELECTRODE)
2g : UBM (METAL FILM)
2h : Au FILM (FIRST METAL FILM)
2i : TiW FILM (SECOND METAL FILM)

MANUFACTURING METHOD OF SEMICONDUCTOR DEVICE, AND MOUNTING STRUCTURE THEREOF

CROSS-REFERENCE TO RELATED APPLICATIONS

The disclosure of Japanese Patent Application No. 2010-121337 filed on May 27, 2010 including the specification, drawings and abstract is incorporated herein by reference in its entirety.

BACKGROUND

The present invention relates to a manufacturing technique of a semiconductor device, and more particularly, to a technique effectively applied to a semiconductor device with an under bump metal (UBM).

There is disclosed a technique regarding a semiconductor device including a multilayer metal film (that is, UBM) formed over an electrode (see, for example, Patent Document 1). Specifically, the aim of the technique is to prevent the surroundings of an upper layer metal film of the multilayer metal film from curling or peeling due to side etching of a lower layer metal film of the multilayer metal film.

RELATED ART DOCUMENTS

Patent Documents

[Patent Document 1]
Japanese Unexamined Patent Publication No. 2006-120803

SUMMARY

Multifunctional (high-tech) flip-chip semiconductor elements with chips ultra-densely packed and bonded together need to achieve pads with a small pitch of about 10 to 20 µm. Thus, it is necessary to form UBMs with a small pitch serving as an underlayer for a bump electrode to be used for flip-chip bonding.

A specific example of a UBM structure will be described below. For example, when an underlayer metal is made of aluminum and the bump electrode is a gold bump, a barrier layer for preventing diffusion of metal or formation of compounds needs to be provided between an aluminum pad and the gold bump, which results in the UBM comprised of a multilayer film including two or more layers.

FIG. 20 shows the structure of a two-layered UBM 50 studied by the inventors of the present application as a comparative example. An aluminum electrode pad 53 is formed over a Si substrate (semiconductor substrate) 51 via an insulating film 52, and further the UBM 50 serving as an underlying metal is formed over the electrode pad 53. A passivation film 54 serving as a protective film is formed over a surface of the Si substrate 51.

The two-layered UBM 50 has, for example, an upper layer 50a comprised of an Au layer, and a lower layer 50b comprised of a TiW layer. In the two-layered UBM 50 (note that the same goes for a UBM with three or more layers), the etching of the lower layer 50b is performed using the upper layer 50a as a mask taking into consideration the convenience of processes and etching of gold (Au) of the upper layer 50a. In general, in order to avoid etching residue, the lower layer 50b is over-etched.

In the case of forming the two-layered UBM 50 by such general processes, although the difference in size between the upper layer 50a and the lower layer 50b depends on the kind of material of the upper and lower layers, the thickness of the layers, the density of patterns on the layers, etchants, and the like, the lower layer 50b is undersize by about 1 to 2 µm with respect to the upper layer 50a. The outer peripheral part of the upper layer 50a is suspended.

As a result, when a suspended part (Au) 55 represented by reference character "A" is curled or peeled in the following cleaning process or the like, the electrical short circuit or adhesion of foreign matter occurs between the adjacent pads, which may cause serious problems associated with quality and reliability.

Further, this may degrade the in-plane uniformity in a next deposition step, or may contaminate an assembly line.

The above Patent Document 1 (Japanese Unexamined Patent Publication No. 2006-120803) discloses a technique for preventing the curling and peeling of the surroundings of the upper layer metal film which may be caused in forming the multilayer metal film. The technique disclosed in the above Patent Document 1, however, involves two photolithography steps during the UBM formation process up to the bonding of the bump, which needs repeated exposures. As a result, the positional accuracy of a pattern is worsened, which makes it difficult to achieve pads with a small pitch of 20 µm or less (of about 10 to 20 µm).

Accordingly, the present invention has been made in view of the forgoing problems, and it is an object of the present invention to provide a technique that can improve the quality and reliability of a semiconductor device.

It is another object of the invention to provide a technique that can enhance the reliability of an assembly line of the semiconductor device.

It is a further object of the invention to provide a technique that can achieve reduction in pitch between pads in manufacturing a UBM.

The above and other objects and the novel features of the invention will become apparent from the description of the present specification and the accompanying drawings.

The outline of representative aspects of the invention disclosed in the present application will be briefly described as follow.

A manufacturing method of a semiconductor device according to a representative aspect of the invention includes the steps of: (a) preparing a semiconductor substrate with a plurality of electrodes formed thereover; (b) forming a multilayer metal film over each of the electrodes; (c) forming a resist film over the multilayer metal film; (d) removing a part of a first metal film as an uppermost layer of the multilayer metal film by etching using the resist film as a mask; (e) removing a part of a second metal film located directly under the first metal film as the uppermost layer in the multilayer metal film by etching using the resist film as the mask; (f) removing another part of the first metal film as the uppermost layer by re-etching using the resist film as the mask; and (g) removing the resist film. The edge of the first metal film as the uppermost layer is located inside or in the same position as the edge of the second metal film directly under the first metal film in planar view of the multilayer metal film formed over each electrode.

Further, a mounting structure of a semiconductor device according to another aspect of the invention includes a semiconductor chip including a plurality of electrodes at a main surface thereof, and multilayer metal films formed over the respective electrodes; a substrate having an upper surface and a lower surface opposite thereto with a plurality of terminals formed at the upper surface; and a plurality of bump electrodes for electrically coupling the multilayer metal film formed over each of the electrodes of the semiconductor chip to each of the respective terminals over the upper surface of the substrate. The edge of a first metal film as an uppermost layer of the multilayer metal film formed over the electrodes of the semiconductor chip is located inside or in the same position as the edge of a second metal film directly under the first metal film as the uppermost layer in planar view.

The effects obtained by the representative aspects of the invention disclosed in the present application will be briefly described below.

According to the invention, the quality and reliability of the semiconductor device can be improved.

The reliability of an assembly line of the semiconductor device can be enhanced.

Reduction in pitch between pads in manufacturing a UBM can be achieved.

DETAILED DESCRIPTION

In the following preferred embodiments, the same or like parts will not be repeatedly described below in principle except when necessary.

The following preferred embodiments may be described below by being divided into a plurality of sections or embodiments for convenience, if necessary, which are not independent from each other except when specified otherwise. One of the sections or embodiments is a modified example, the details, a supplemental explanation, or the like of a part or all of the other.

When reference is made to the number of elements or the like (including the number of pieces, numerical values, quantity, range, etc.) in the embodiments below, the number thereof is not limited to a specific number, and may be greater than, or less than, or equal to the specific number, unless otherwise specified and definitely limited to the specific number in principle.

It is also needless to say that components (including elements or steps, etc.) employed in the following description of the embodiments are not always essential, unless otherwise specified and considered to be definitely essential in principle.

It goes without saying that the term "comprised of A", "made of A", "having A", or "including A" used in describing a component or the like in the preferred embodiments does not exclude any element other than "element A", except when clearly demonstrating that it consists of only A. Similarly, when reference is made to the shapes, positional relations and the like of the components or the like in the embodiments, they will include those substantially analogous or similar to their shapes or the like, unless otherwise specified and considered not to be definitely so in principle, etc. This is also similarly applied even to the above-described numerical values and range.

In the following, the preferred embodiments of the invention will be described in detail with reference to the accompanying drawings. Wherever possible, throughout the drawings for explaining the embodiments, the same reference numbers will be used to refer to parts having the same function, and a repeated description thereof will be omitted below.

First Embodiment

Figure 1:
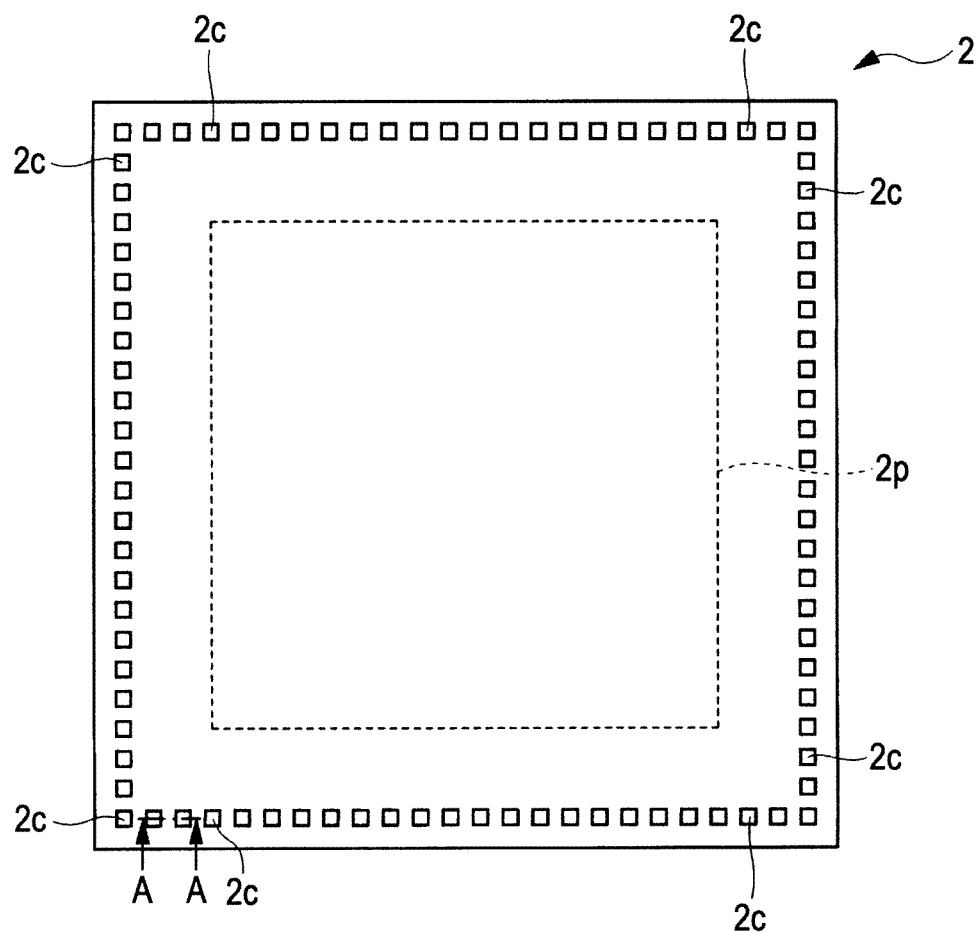
FIG. 1 is a plan view showing an example of the structure of a semiconductor device according to a first embodiment of the invention.
Figure 2:
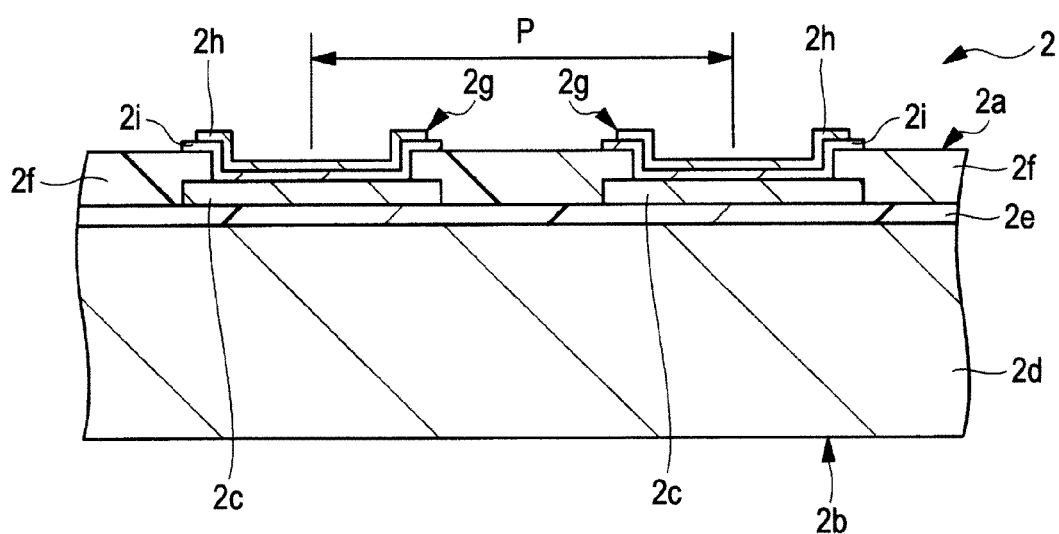
FIG. 2 is an enlarged partial cross-sectional view showing the structure taken along the line A-A of FIG. 1.
Figure 3:
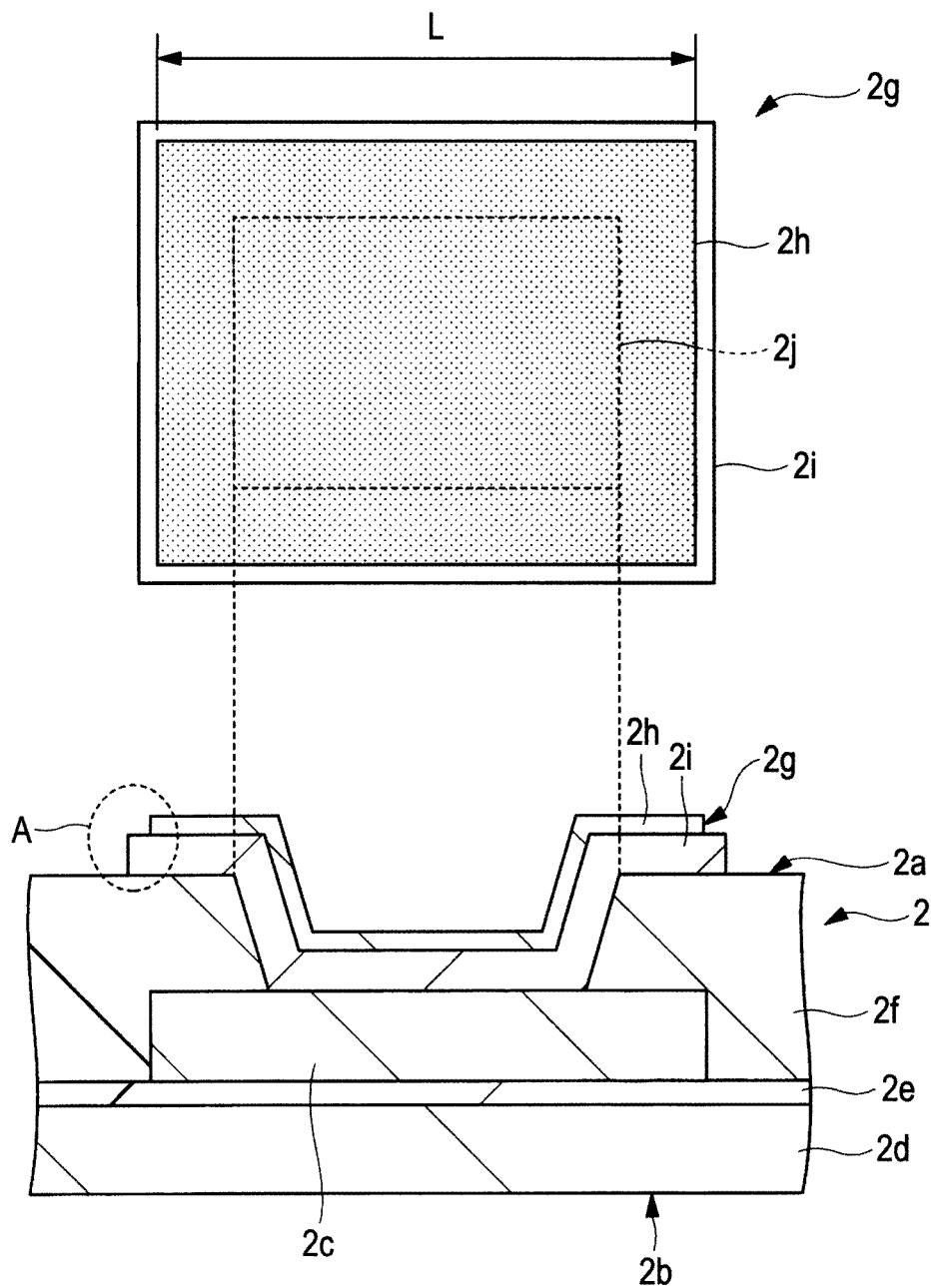
FIG. 3 shows a partial plan view and a partial cross-sectional view of an example of a pad structure in the semiconductor device of the first embodiment.

FIG. 1 shows a plan view of one example of the structure of a semiconductor device according to a first embodiment of the invention. FIG. 2 shows an enlarged partial cross-sectional view of the structure taken along the line A-A of FIG. 1. FIG. 3 shows a partial plan view and a partial cross-sectional view of one example of a pad structure of the semiconductor device of the first embodiment.

In a semiconductor device of the first embodiment, a UBM (metal film) 2g is formed as a underlayer metal for bonding a bump electrode over each electrode pad (electrode) 2c of a semiconductor chip 2 including a semiconductor integrated circuit. For example, the semiconductor device of this embodiment is effectively applied to products including pads with a small pitch, such as a logic large scale integration (LSI), a sensor, or a liquid crystal display (LCD) driver, but is not limited to such products.

Now, the structure of the semiconductor chip 2 will be described below with reference to FIGS. 1 to 3. The semiconductor chip 2 includes a silicon (Si) substrate 2d serving as a base substrate with a metal oxide semiconductor (MOS) or the like formed thereover, a plurality of electrode pads 2c formed in a wiring layer over the silicon substrate 2d via an insulating film 2e, a UBM 2g which is a metal film formed over each electrode pad 2c, and a passivation film 2f which is a protective film formed around the UBM 2g.

As shown in FIG. 1, the semiconductor chip 2 includes a circuit region 2p inside an array of the electrode pads 2c provided at the peripheral edge of the chip 2. The circuit region 2p mainly has a circuit comprised of a MOS (metal oxide semiconductor) formed therein. The MOS circuit is, by way of example, a logic LSI circuit comprised of a complementary metal oxide semiconductor (CMO).

The semiconductor chip 2 has a main surface 2a and a back surface 2b opposite thereto as shown in FIG. 2. The electrode pads 2c are arranged side by side at the inner peripheral edge of the main surface 2a, with parts thereof exposed, as shown in FIG. 1. Referring to FIG. 2, the electrode pads 2c are provided with a small pitch of, for example, 10 to 20 μm (P=10 to 20 μm), but may be provided with a pitch of 20 μm or more. The electrode pad 2c is provided in the same layer as the wiring layer, and formed of, for example, aluminum. That is, the electrode pad 2c is an aluminum electrode pad 2c.

As shown in FIG. 3, the corresponding electrode pad 2c has its part exposed at an opening 2j of the passivation film 2f. The UBM 2g which is an underlayer metal for bonding the bump electrode is electrically coupled to the exposed part of the electrode pad 2c. That is, the UBM 2g comprised of a multi-layer metal film, which is an underlayer metal for bonding the bump electrode, is formed over the corresponding electrode pad 2c. The UBM 2g is provided in the opening 2j of the passivation film 2f to cover the opening 2j and to be coupled to the electrode pad 2c, so that the UBM 2g is in a concave shape.

For example, when a pad pitch is 20 μm, the UBM 2g has a size of about 10 μm (L=10 μm). When a pad pitch is 10 μm, the UBM 2g has a size of about 5 μm (L=5 μm).

The UBM 2g shown in FIG. 3 has a two-layered structure comprised of an Au film 2h which is a first metal film as an upper layer, and a TiW film 2i which is a second metal film as a lower layer. That is, the UBM 2g includes the Au film 2h as the uppermost metal layer, and the TiW film 2i as the metal film located directly under the uppermost metal layer.

The UBM 2g is not limited to the two-layered structure, and may be a three or more layered structure.

The TiW film 2i as the lower layer of the two-layered UBM 2g is a barrier metal for preventing diffusion of metal and formation of compounds at the upper/lower layer. The TiW film 2i has a thickness, for example, of about 250 to 400 nm. The Au film 2h as the upper layer is made of metal for enhancing conductivity and bonding stability with the bump electrode. The Au film 2h has a thickness, for example, of about 50 to 200 nm.

As represented by the "A" part in the cross-sectional view and plan view of FIG. 3, the edge of the Au film 2h as the upper layer (uppermost layer) in the UBM 2g is located inside the edge of the TiW film 2i as the lower layer (directly under the Au film) around the entire periphery thereof in planar view. That is, the Au film 2h as the upper layer in the UBM 2g is smaller than the TW film 2i as the lower layer in planar view. The Au film 2h as the upper layer is undersize around the entire periphery thereof with respect to the TiW film 2i as the lower layer.

Figure 20:
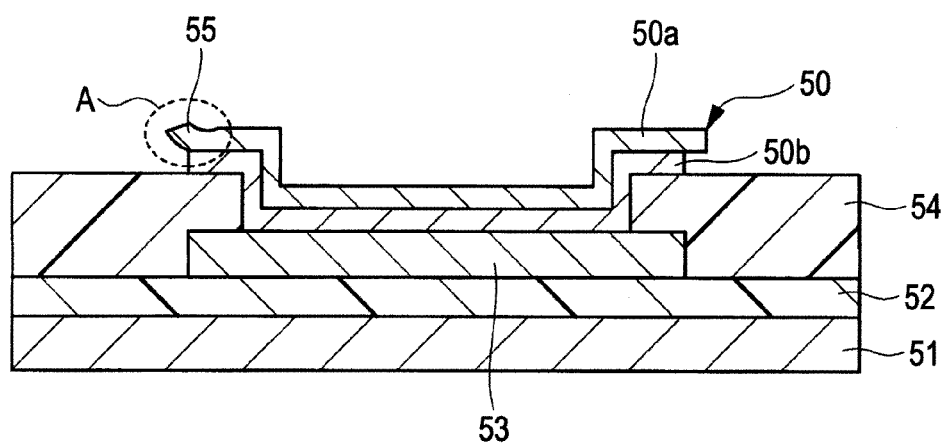
FIG. 20 is a partial cross-sectional view showing a pad structure in a comparative example.

In this way, the UBM 2g is formed over the electrode pad 2c such that the Au film 2h as the upper layer is undersize around the entire periphery thereof with respect to the TiW film 2i as the lower layer, which can suppress the formation of a suspended part 55 of an upper layer 50a as shown in FIG. 20.

This arrangement can prevent the occurrence of electrical short circuit between the adjacent pads due to the suspended part 55, and can also prevent the adhesion of the suspended part 55 as foreign matter to a semiconductor substrate.

Thus, the quality and reliability of the semiconductor chip (semiconductor device) 2 can be improved.

Next, a formation method of the UBM 2g in the first embodiment will be described using FIGS. 4 to 6.

Figure 4:
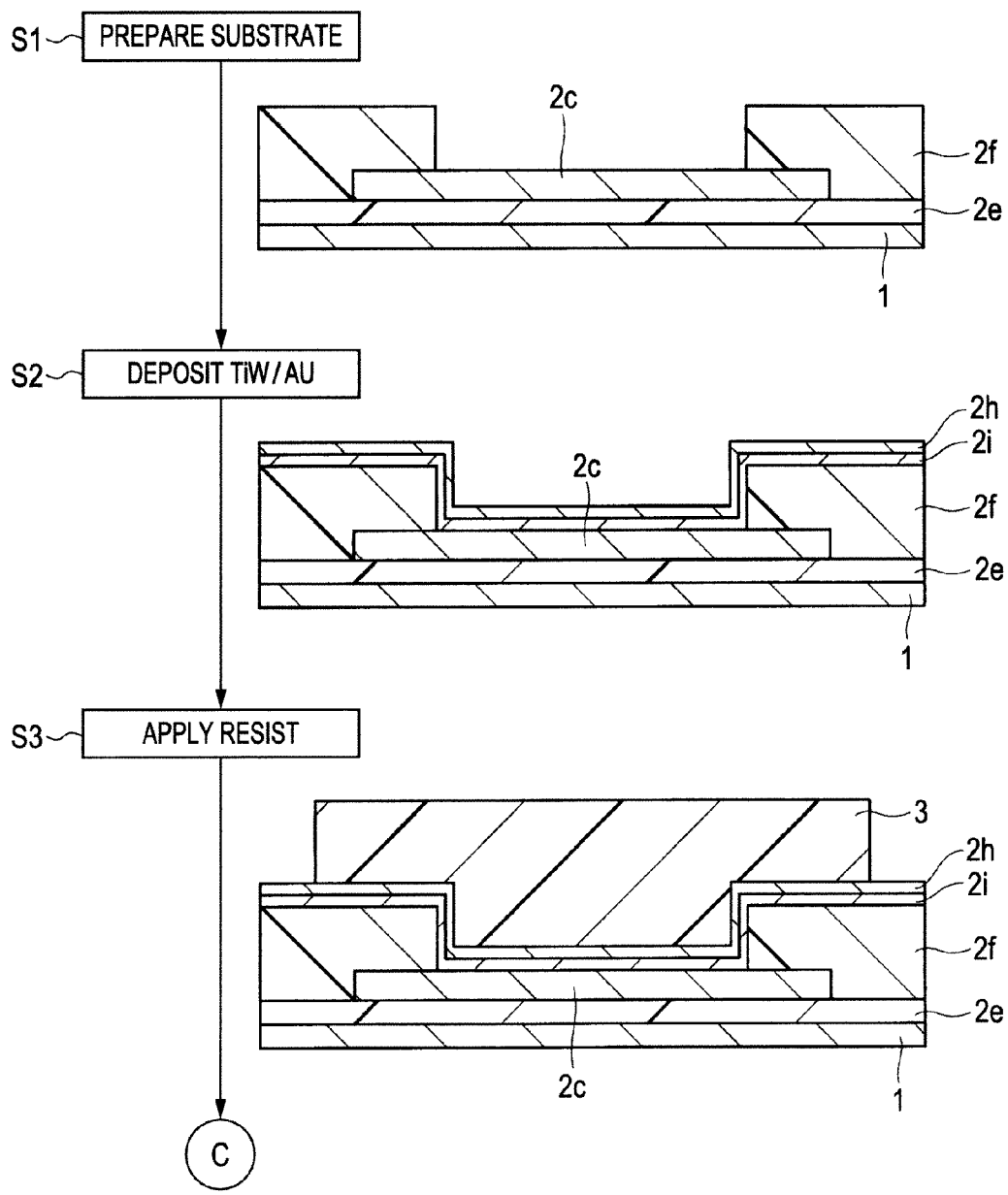
FIG. 4 is an enlarged partial cross-sectional view with a manufacturing process flow until application of a resist in formation of a UBM during assembly of the semiconductor device shown in FIG. 1.

FIG. 4 shows an enlarged partial cross-sectional view with a manufacturing process flow until application of a resist in formation of the UBM during assembly of the semiconductor device shown in FIG. 1. FIG. 5 shows an enlarged partial cross-sectional view with a manufacturing process flow until etching of a lower layer in formation of the UBM during the assembly of the semiconductor device shown in FIG. 1. FIG. 6 shows an enlarged partial cross-sectional view with a manufacturing process flow until removal of the resist in formation of the UBM during the assembly of the semiconductor device shown in FIG. 1.

Figure 5:
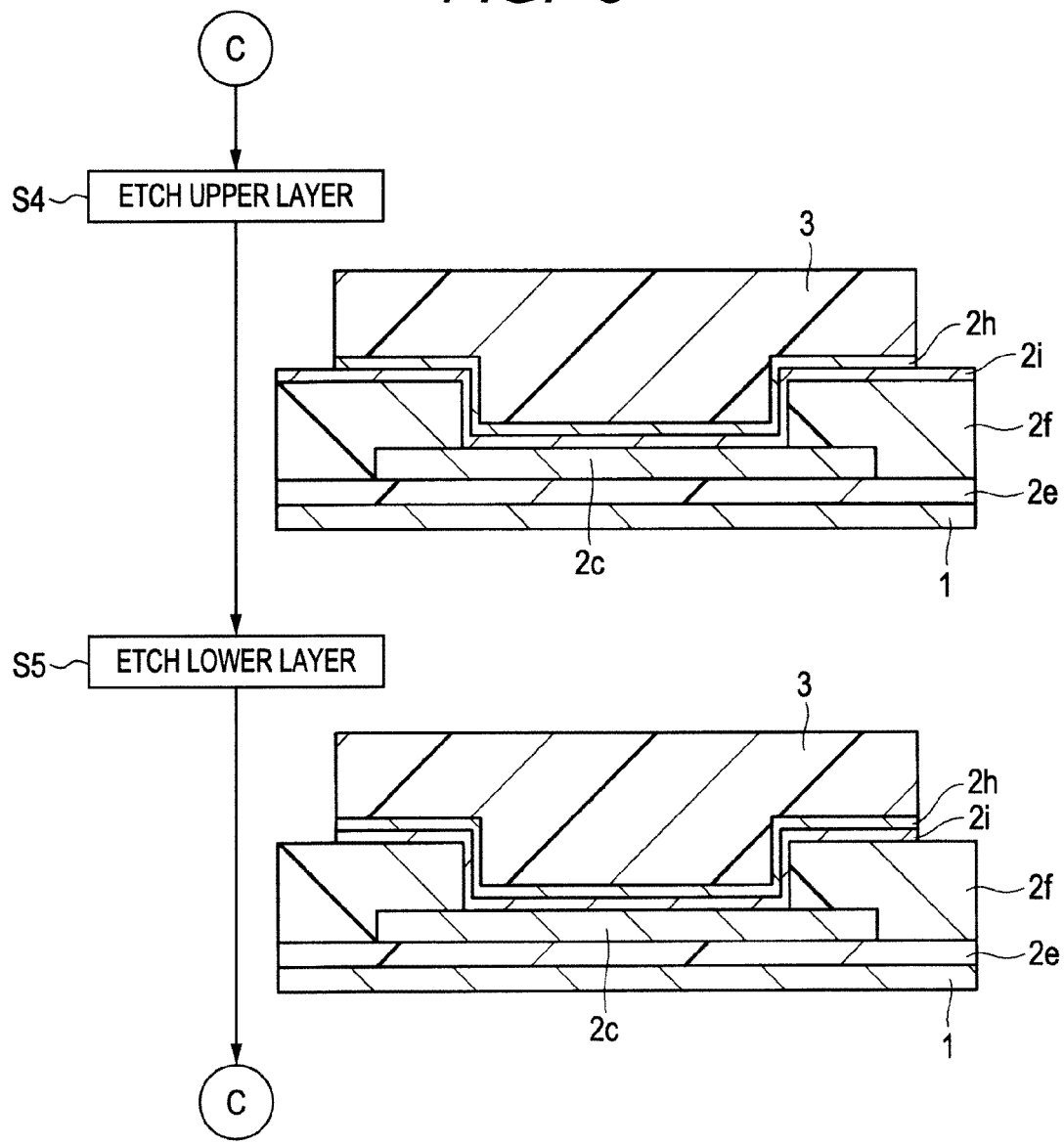
FIG. 5 is an enlarged partial cross-sectional view with a manufacturing process flow until etching of a lower layer in formation of the UBM during the assembly of the semiconductor device shown in FIG. 1.
Figure 6:
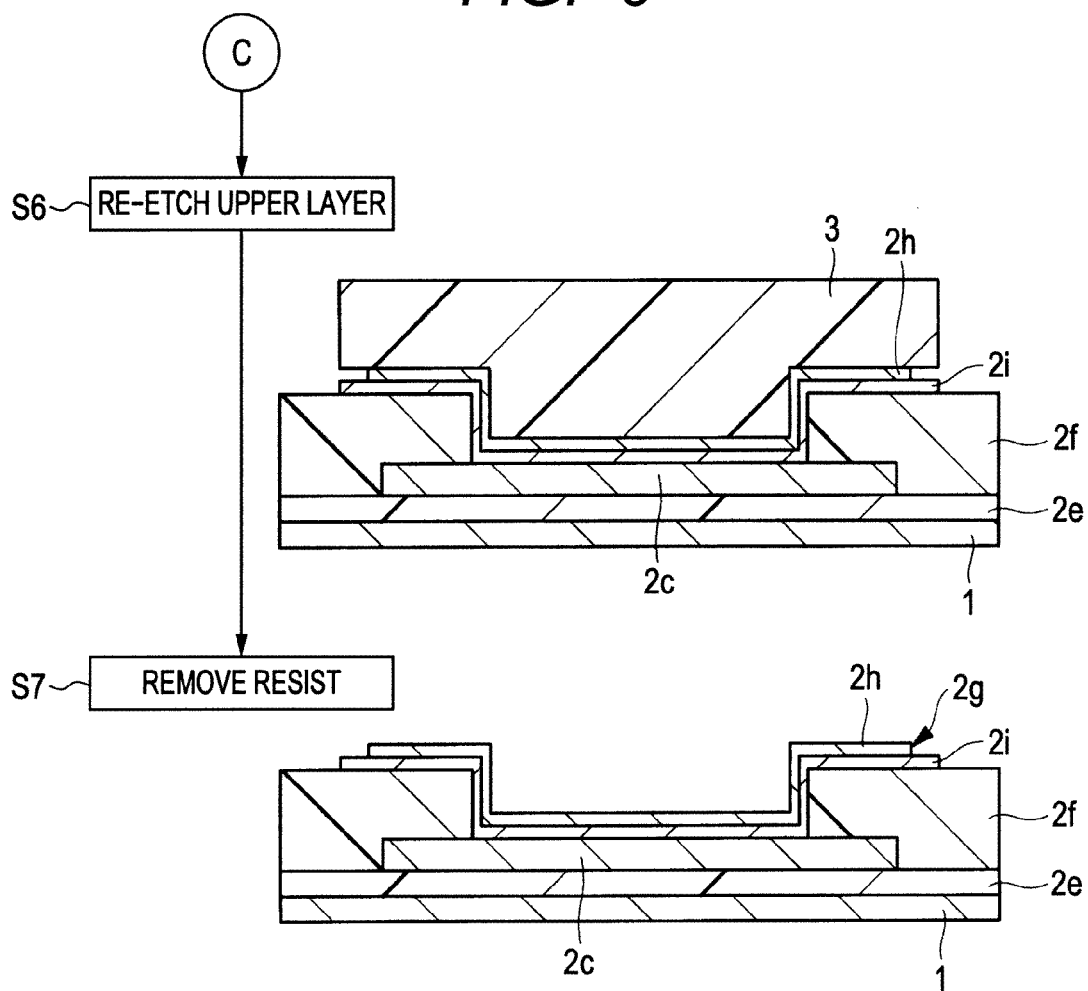
FIG. 6 is an enlarged partial cross-sectional view with a manufacturing process flow until removal of a resist in formation of the UBM during the assembly of the semiconductor device shown in FIG. 1.

FIGS. 4 to 6 illustrate the formation of the UBM over the electrode pad in the form of wafer. First, as represented by step S1 in FIG. 4, a silicon substrate 1 which is a semiconductor substrate with electrode pads (electrodes) 2c formed thereover is prepared. The electrode pad 2c is formed in the wiring layer over the silicon substrate 1 via the insulating film 2e. The electrode pad 2c is, for example, an aluminum electrode pad comprised of aluminum.

Then, TiW/Au is deposited in step S2. The UBM 2g comprised of a multilayer (two-layered) metal film is formed over each of the electrode pads 2c. The upper layer (uppermost layer) of the UBM 2g is, for example, the Au film (first metal film) 2h, and the lower layer is, for example, the TiW film (second metal film) 2i.

The Au film 2h as the upper layer is a metal for enhancing conductivity and bonding stability with the bump electrode. The TiW film 2h has a thickness, for example, of about 50 to 200 nm.

On the other hand, the TiW film 2i as the lower layer is a barrier metal for preventing diffusion of metal and formation of compounds at the upper/lower layer. The TiW film 2*i* has a thickness, for example, of about 250 to 400 nm.

Then, a resist is applied in step S3, so that a resist film 3 is formed over the Au film 2*h*. At this time, the resist film 3 is formed such that a part for side etching of the UBM 2*g* is oversize with respect to the designed value. Specifically, the resist film 3 is formed in such a size that is larger around the entire periphery thereof than that of a finally formed part of the Au film 2*h* as the upper layer in planar view.

Then, the upper layer is etched in step S4 shown in FIG. 5. That is, a part of the Au film 2*h* as the upper layer (uppermost layer) in the UBM (two-layered metal film) 2*g* is removed by etching using the resist film 3 as a mask. The etching at this time is just etching as shown in FIG. 5. Thus, the Au film 2*h* is etched so as to have the same size as the resist film 3 in planar view. An etchant (etching solution) used in etching the Au film 2*h* is, for example, an iodine solution. When possible, dry etching may be performed.

Then, the lower layer is etched in step S5. That is, the TiW film 2*i* (as the lower layer) directly under the Au film 2*h* as the upper layer (uppermost layer) in the UBM 2*g* is subjected to etching using the resist film 3 as a mask, so that a desired part of the TiW film 2*i* is removed. The etching at this time is the just etching as shown in FIG. 5, like the etching of the Au film 2*h*. Thus, the TiW film 2*i* is etched so as to have the same size as that of each of the resist film 3 and the Au film 2*h* in planar view. The TiW film 2*i* (as the lower layer) directly under the Au film 2*h* is etched such that the edge of the TiW film 2*i* (as the lower layer) directly under the Au film 2*h* as the upper layer (as the uppermost layer) is located in the same position as the edge of the Au film 2*h* as the upper layer in planar view. Thus, the TiW film 2*i* as the lower layer is etched so as to have the same size as the Au film 2*h* as the upper layer.

The etchant (etching solution) used for etching the TiW film 2*i* is, for example, a hydrogen peroxide solution. The amount of etching the TiW film 2*i* is adjusted by controlling an etching rate by an additive to the solution, the temperature of the solution, or the like. When possible, dry etching may be performed.

Thereafter, the upper layer is re-etched in step S6 shown in FIG. 6. That is, the Au film 2*h* as the upper layer (uppermost layer) is re-etched using the resist film 3 as a mask, whereby a part of the Au film 2*h* is removed. At this time, the part of the Au film 2*h* located under the resist film 3 is removed through side etching by performing over-etching. That is, the Au film 2*h* as the upper layer is side-etched such that the edge of the Au film 2*h* as the upper layer (as the uppermost layer) is located inside the edge of the TiW film 2*i* located directly under the Au film (as the lower layer) in planar view. In this way, as shown in FIG. 3, the Au film 2*h* as the upper layer is formed such that the edge of the Au film 2*h* is located inside the edge of the TiW film 2*i* directly under the Au film in planar view of the UBM 2*g*.

In other words, the Au film 2*h* is formed such that in planar view of the UBM 2*g* formed over each of the electrode pads 2*c*, the size of the Au film 2*h* as the upper layer (uppermost layer) is smaller than that of the TiW film 2*i* (as the lower layer) directly under the Au film.

The amount of side etching of the Au film 2*h* depends on the kind, or thickness of the metal, the pattern density, or the etchant. In the example shown in FIG. 6, the amount of side etching is, for example, about 1 to 2 μm. An etchant (etching solution) used in re-etching the upper layer in step S6 is, for example, an iodine solution. The amount of etching the Au film 2*h* is adjusted by controlling an etching rate by an additive to the solution, the temperature of the solution, or the like.

After etching the Au film 2*h* into a desired size, the resist is removed in step S7 shown in FIG. 6. At this time, the resist film 3 is removed by being peeled.

As described above, the formation of the two-layered UBM 2*g* over the electrode pad 2*c* located over the silicon substrate 1 is completed.

In the formation method of the UBM 2*g* of the first embodiment, one-time photolithography is performed and the etching rate is controlled. Accordingly, the UBM 2*g* can be formed by a simple process, for example, which can enhance the size/position accuracy with respect to other processes involving two photolithography steps. As a result, the formation method is appropriate to the microfabrication, and is more effectively applied to the microfabrication.

After forming the UBM 2*g* over each electrode pad 2*c* in the form of wafer, the silicon substrate 1 is cut into semiconductor chips 2.

Figure 7:
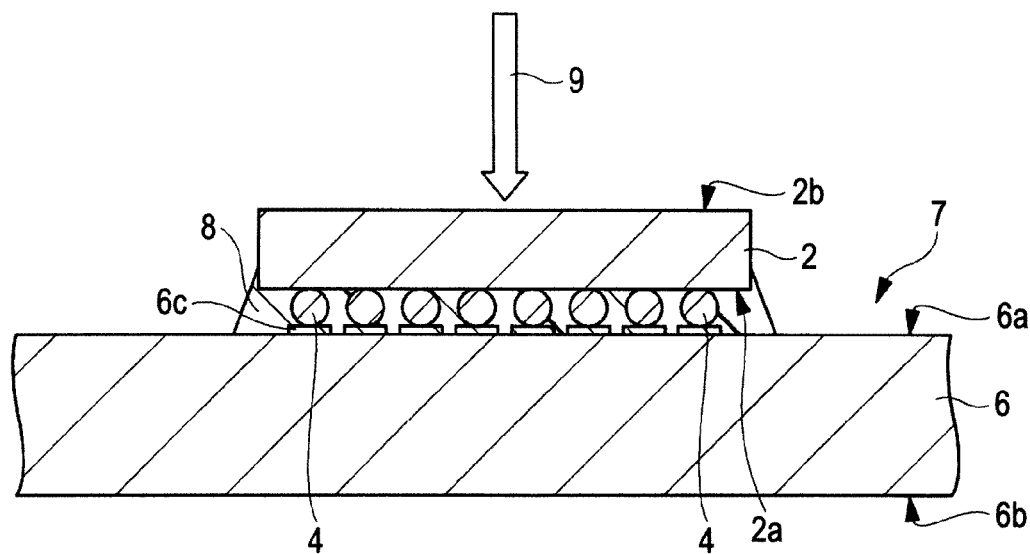
FIG. 7 is a cross-sectional view showing an example of a mounting structure of the semiconductor device shown in FIG. 1.
Figure 8:
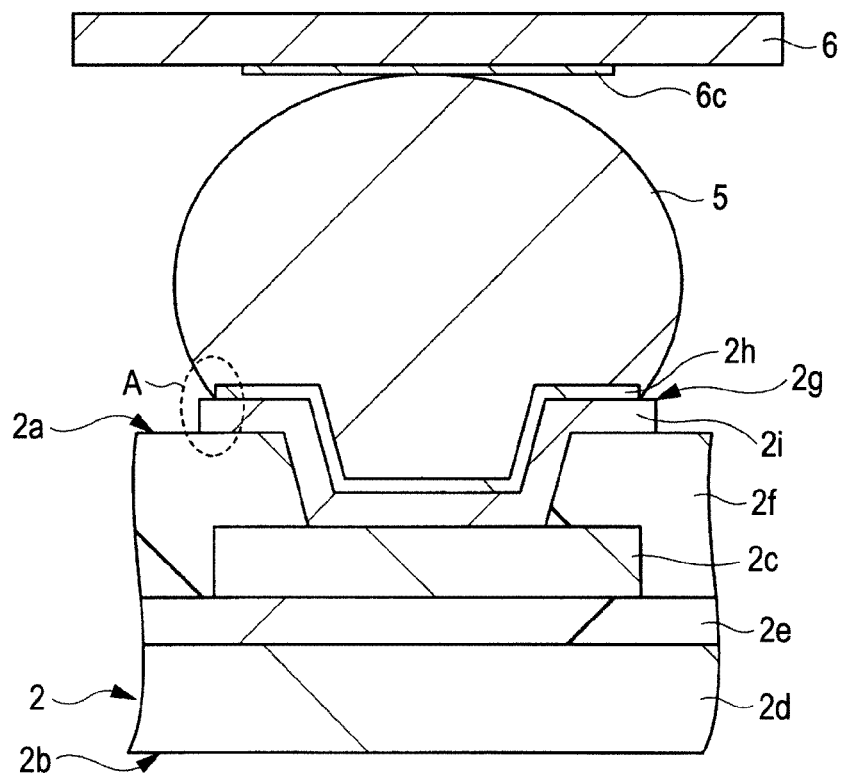
FIG. 8 is an enlarged partial cross-sectional view showing an example of the mounting structure using a solder bump of the semiconductor device shown in FIG. 1.

As shown in FIG. 7, a gold bump 4 serving as a bump electrode is bonded to the UBM 2*g* in the semiconductor chip 2 with the UBM 2*g* formed over each electrode pad 2*c*. The semiconductor chip 2 is electrically coupled to the substrate via the gold bumps 4. Alternatively, as shown in FIG. 8, a solder bump 5 serving as a bump electrode may be bonded to the UBM 2*g*. The semiconductor chip 2 may be electrically coupled to the substrate via the solder bumps 5.

FIG. 7 shows a cross-sectional view showing an example of a mounting structure of the semiconductor device shown in FIG. 1. FIG. 8 is an enlarged partial cross-sectional view showing an example of the mounting structure of the semiconductor device by use of a solder bump shown in FIG. 1.

FIG. 7 shows the example of the mounting structure (module 7) of the semiconductor chip (semiconductor device) 2 via the gold bump 4.

Specifically, the module 7 includes the semiconductor chip 2 having electrode pads (electrodes) 2*c* formed over a main surface 2*a* and shown in FIG. 1, and the UBMs 2*g* formed over the respective electrode pads 2*c* of the first embodiment and shown in FIG. 2. The module 7 also includes an organic substrate (substrate) 6 having an upper surface 6*a* and a lower surface 6*b* opposite thereto with a plurality of leads (terminals) 6*c* formed over the upper surface 6*a*, and a plurality of gold bumps (bump electrodes) 4 for electrically coupling the UBMs 2*g* over the electrode pads 2*c* of the semiconductor chip 2 to the respective leads 6*c* over the upper surface 6*a* of the organic substrate 6.

Thus, in the module 7, the semiconductor chip 2 is electrically coupled to (flip-chip bonded) the organic substrate 6 via the gold bumps 4. In this case, the respective gold bumps come into contact with and are electrically coupled to the leads (terminals) 6*c* over the upper surface 6*a* of the organic substrate 6. For example, resin 8, such as underfill resin, or anisotropic conductive resin, is disposed around the bonding parts of the gold bumps 4. The resin 8 supports the bump bonding.

When the module 7 is an image sensor, the semiconductor chip 2 incorporating therein a CMOS circuit often performs detection by taking light 9 from the back surface 2*b* (upper side) as shown in FIG. 7.

As shown in FIG. 3, in the semiconductor chip 2 with the module 7 mounted thereover, the edge of the Au film 2*h* as the upper layer (uppermost layer) in the UBM 2*g* formed over each of the electrode pads 2*c* is located inside the edge of the TiW film 2*i* as the lower layer in planar view. In this case, the size of the Au film 2*h* as the upper layer is smaller than that of the TiW film 2*i* as the lower layer in planar view of the UBM 2*g*.

Figure 21:
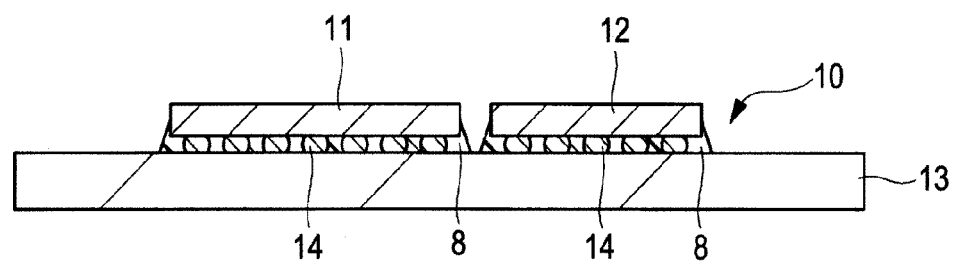
FIG. 21 is a cross-sectional view showing a modified example of the mounting structure of the semiconductor device in the invention.

FIG. 21 shows a modified example of the mounting structure (module 10) of the semiconductor device via the bump electrodes. A memory chip 11 and a logic LSI chip 12 are flip-chip mounted over a Si(silicon) interposer 13 via respective microbumps 14. The respective microbumps 14 are electrically coupled to electrodes over the Si interposer 13. For example, resin 8, such as an underfill resin, is disposed around the bonding parts of the microbumps 14. Also, in the module 10, the respective electrodes over the Si interposer 13 are electrically coupled to the microbumps 14, and have the UBM structure of the first embodiment.

FIG. 8 shows an example of mounting the semiconductor chip 2 via the semiconductor bumps 5. The semiconductor chip 2 is mounted over the organic substrate 6 via the solder bumps 5. Each solder bump 5 formed over the UBM 2g of the semiconductor chip 2 is coupled to the lead 6c of the organic substrate 6.

Also, in the semiconductor chip 2, the Au film 2h as the upper layer is smaller than the TiW film 2i as the lower layer in planar view of the UBM 2g. In this way, the edge of the Au film 2h as the upper layer is located inside the edge of the TiW film 2i as the lower layer, whereby the Au film 2h as the upper layer is smaller (undersize) than the TiW film 2i as the lower layer, which can suppress the transverse expansion of the solder bump 5 at the time of fusion as represented by reference numeral "A" in FIG. 8, thus effectively reducing a pitch between the pads.

The substrate with the semiconductor chip 2 mounted thereover via the gold bumps 4 or the solder bumps 5 is not limited to the organic substrate 6, but may be, for example, a silicon substrate, a glass substrate, or the like.

In the manufacturing method and the mounting structure (module 7) of the semiconductor device (semiconductor chip 2) of the first embodiment, the edge of the Au film 2h as the upper layer is located inside the edge of the TiW film 2i as the lower layer directly under the Au film in the UBM 2g formed over the electrode pad 2c located over the semiconductor substrate. This arrangement can suppress the formation of the suspended part 55 in the Au film 2h as shown in FIG. 20.

That is, in formation of the UBM 2g, after only one photolithography step, the Au film 2h as the upper layer is etched by a predetermined amount, and further the TiW film 2i as the lower layer is etched by another predetermined amount. Then, the Au film 2h as the upper layer is re-etched (side-etched) by a further predetermined amount. As a result, the Au film 2h as the upper layer can be formed to be smaller than the TiW film 2i as the lower layer in planar view.

This arrangement can suppress the formation of the suspended part 55 in the Au film 2h as an upper layer, which can prevent the occurrence of the electrical short circuit between the adjacent pads due to the suspended part 55, and also can prevent the adhesion of the suspended part 55 as the foreign matter to the semiconductor substrate.

As a result, the quality and reliability of the semiconductor device (semiconductor chip 2) can be improved.

Since the formation of the suspended part 55 of the Au film 2h as the upper layer can be suppressed, the occurrence of the non-uniform deposition (variations in deposition) in the next step can be reduced, and the causes of contamination of the assembly line of the semiconductor device can also be reduced.

Therefore, the reliability of the assembly line of the semiconductor device can be enhanced.

The UBM 2g is formed only by one photolithography process, which can increase the processing accuracy of etching. This method can be applied to the microfabrication, and thus can be applied to products with a small pitch (for example, of 20 μm or less).

Thus, the electrode pads 2c with the small pitch can be achieved in the manufacture of the UBM 2g.

During forming the UBM 2g of the first embodiment, the manufacturing processes can be performed in the form of wafer until the UBM 2g is formed, and thus a bump electrode to be located over the UBM 2g cannot be formed.

In this way, the manufacturing processes in the form of wafer can be performed only until the UBM 2g is formed, which can achieve the pads with the small pitch.

Now, a modified example of the first embodiment will be described.

Figure 9:
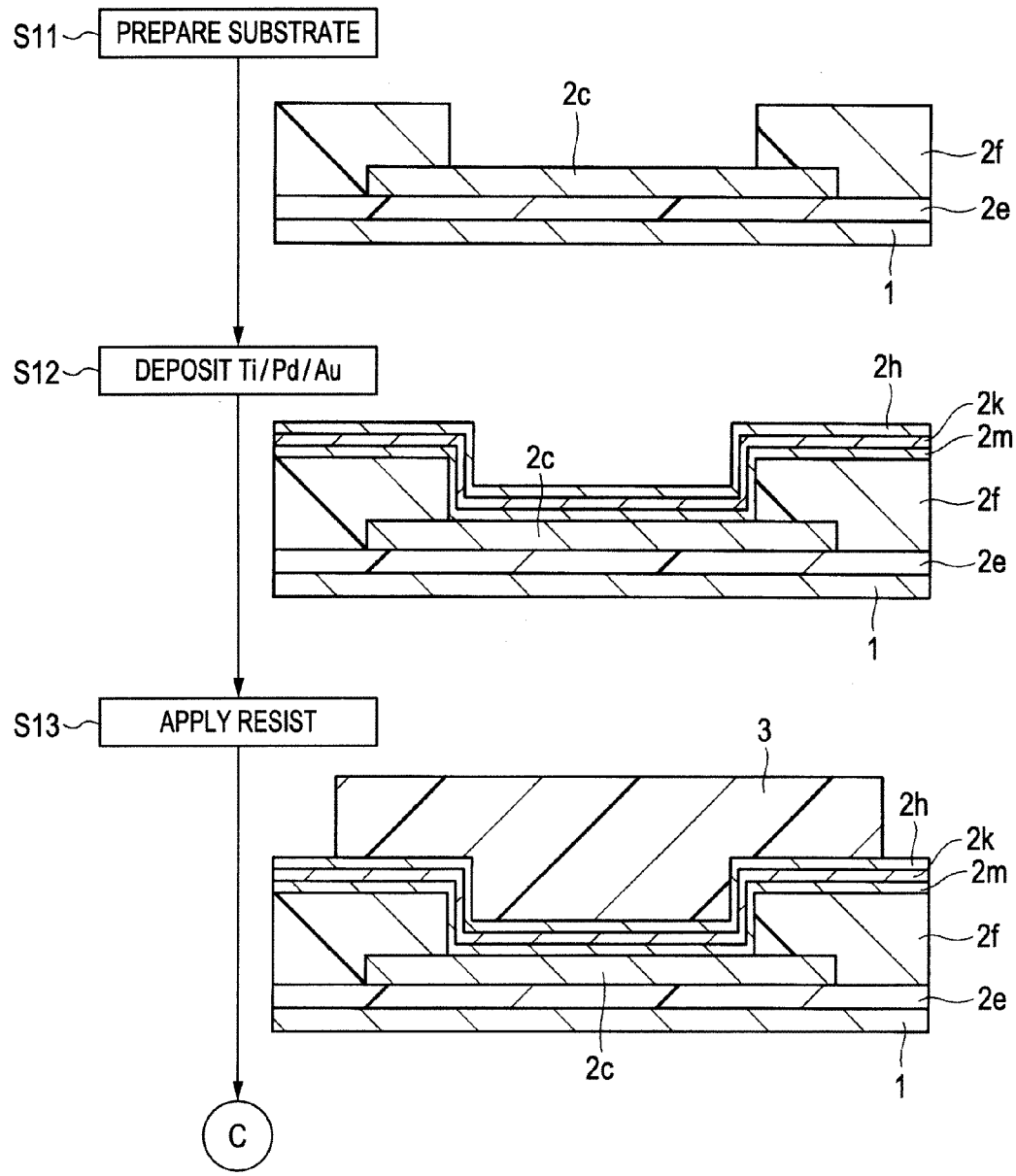
FIG. 9 is an enlarged partial cross-sectional view with a manufacturing process flow until application of a resist in formation of the UBM during assembly of a semiconductor device in a modified example of the first embodiment.
Figure 10:
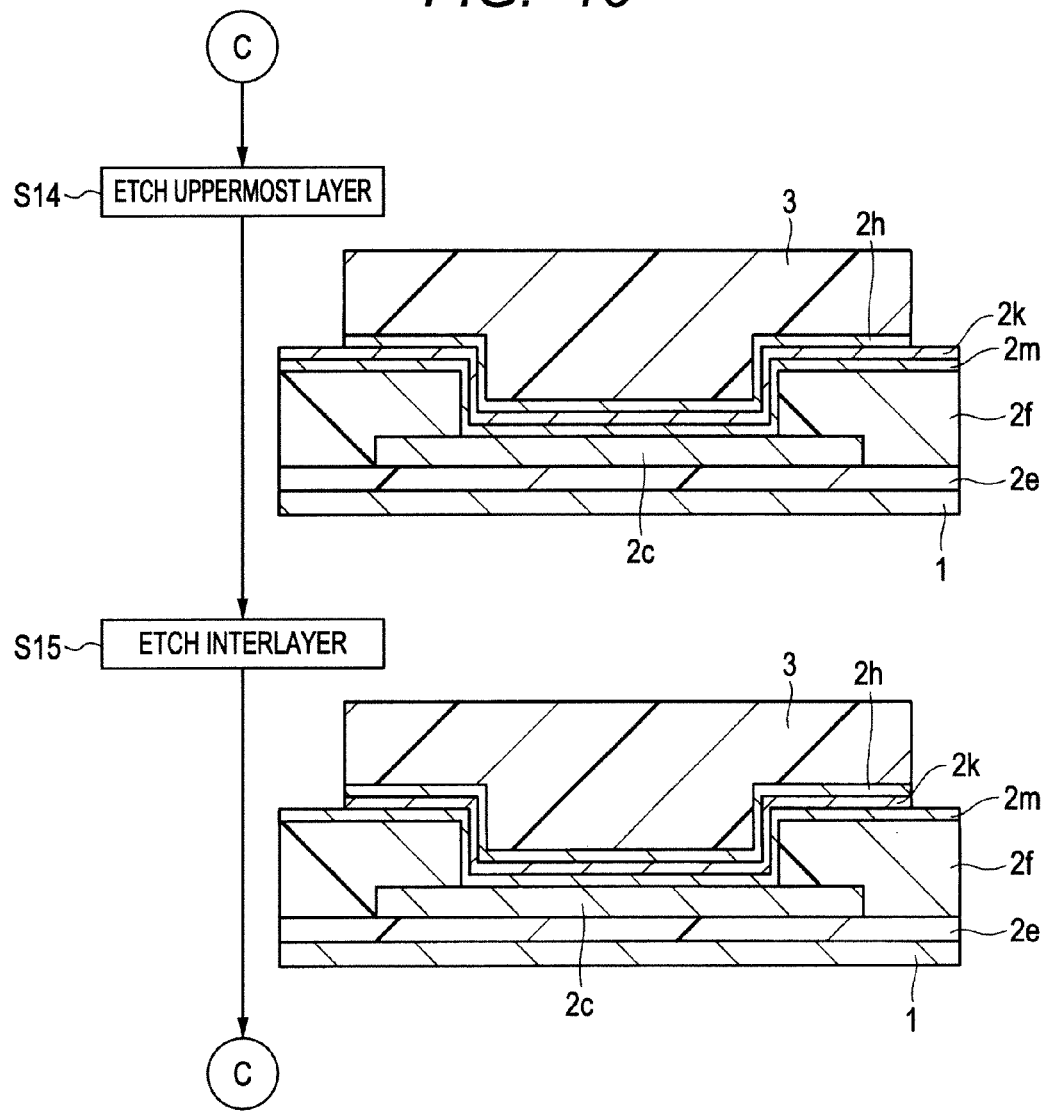
FIG. 10 is an enlarged partial cross-sectional view with a manufacturing process flow until etching of an interlayer in formation of the UBM during the assembly of the semiconductor device in the modified example of the first embodiment.
Figure 11:
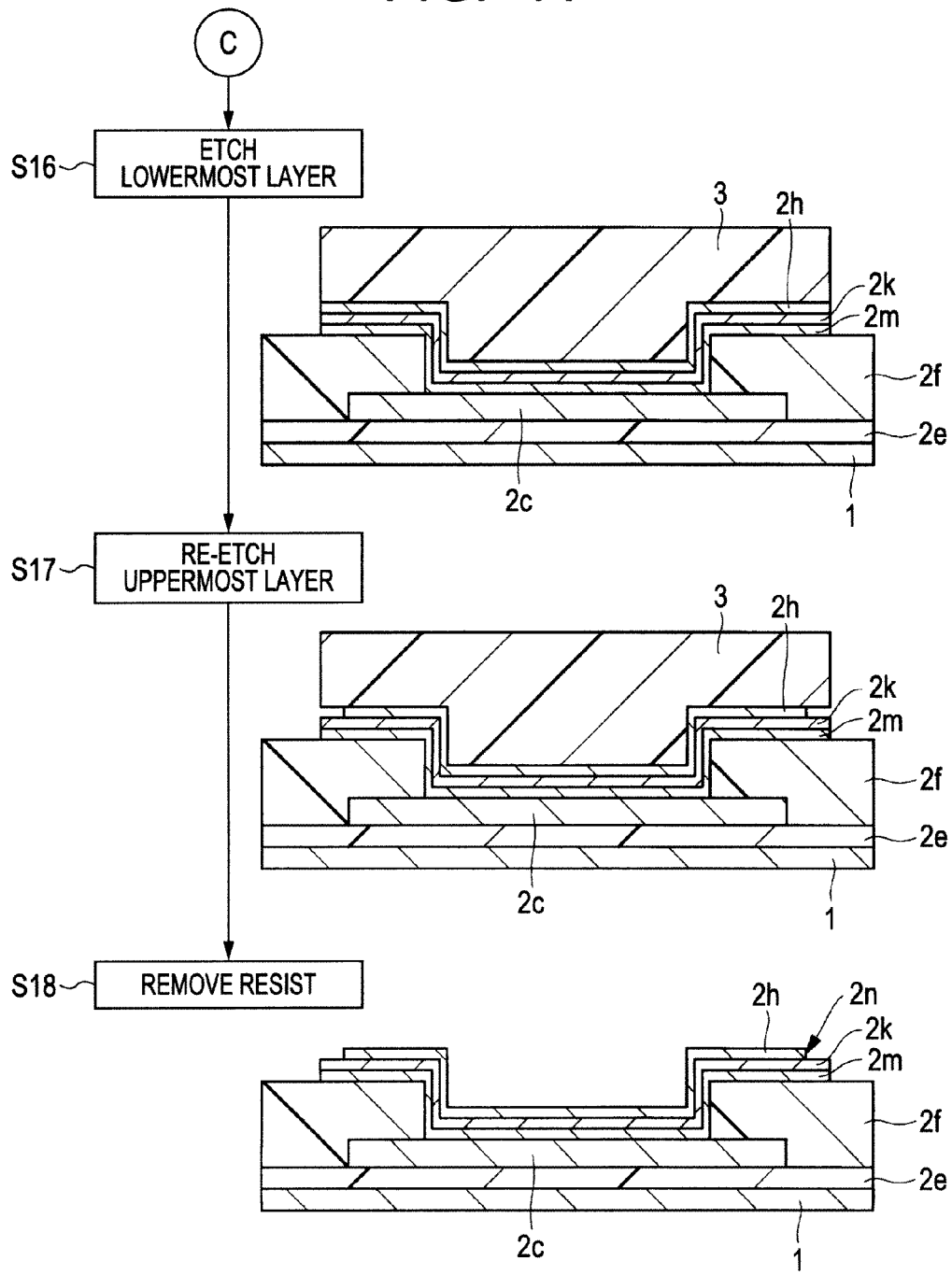
FIG. 11 is an enlarged partial cross-sectional view with a manufacturing process flow until removal of a resist information of the UBM during the assembly of the semiconductor device in the modified example of the first embodiment.

FIG. 9 is an enlarged partial cross-sectional view with a manufacturing process flow until application of a resist in formation of the UBM during assembly of a semiconductor device in a modified example of the first embodiment. FIG. 10 is an enlarged partial cross-sectional view with a manufacturing process flow until etching of an interlayer in formation of the UBM during the assembly of the semiconductor device in the modified example of the first embodiment. FIG. 11 is an enlarged partial cross-sectional view with a manufacturing process flow until removal of the resist in formation of the UBM during the assembly of the semiconductor device in the modified example of the first embodiment.

FIGS. 9 to 11 show a formation procedure of a UBM 2n in the modified example. By way of example, the UBM 2n is a three-layered metal film as shown in FIG. 11.

The three-layered UBM 2n has a first metal film comprised of an Au film 2h as the uppermost layer, a second metal film comprised of a Pd film 2k as a layer directly under the first metal film (as an interlayer), and a third metal film comprised of a Ti film 2m as the lowermost layer as will be described by way of example later.

First, as represented by step S11 in FIG. 9, a silicon substrate 1 which is a semiconductor substrate with electrode pads (electrodes) 2c formed thereover is prepared. The electrode pad 2c is formed in the wiring layer over the silicon substrate 1 via the insulating film 2e. The electrode pad 2c is, for example, an aluminum electrode pad comprised of aluminum.

Thereafter, Ti/Pd/Au is deposited in step S12. The UBM 2n comprised of a multilayer (three-layered) metal film is formed over each of the electrode pads 2c as shown in FIG. 11. The upper layer (uppermost layer) of the UBM 2n is an Au film (first metal film) 2h. The second metal film directly under the first film (interlayer) is a Pd film 2k. The third metal film as the lower layer (lowermost layer) is a Ti film 2m.

The Au film 2h as the uppermost layer is made of metal for enhancing the conductivity and bonding stability with the bump electrode. The Pd film 2k as the interlayer is made of barrier-metal for preventing the diffusion of metal and formation of compounds of the uppermost layer/interlayer. The Ti film 2m as the lowermost layer is made of barrier-metal for preventing the diffusion of metal and formation of compounds of the interlayer/lowermost layer.

Then, a resist is applied in step S13, so that a resist film 3 is formed over the Au film 2h. At this time, the resist film 3 is formed such that a part for side etching of the UBM 2n is oversize with respect to the designed value. Specifically, the resist film 3 is formed in such a size that is larger around the entire periphery thereof than that of a finally formed part of the Au film 2h as the uppermost layer in planar view.

Then, the uppermost layer is etched in step S14 shown in FIG. 10. That is, a part of the Au film 2h as the uppermost layer in the UBM (three-layered metal film) 2n is removed by etching using the resist film 3 as a mask. The etching at this time is a just etching as shown in FIG. 10. Thus, the Au film 2h is etched so as to have the same size as the resist film 3 in planar view. An etchant (etching solution) used in etching the Au film 2h is, for example, an iodine solution. When possible, dry etching may be performed.

Then, the interlayer is etched in step S15. That is, the Pd film 2k (as the interlayer) directly under the Au film 2h as the uppermost layer in the UBM 2n is etched using the resist film 3 as a mask, whereby a part of the Pd film 2k is removed. The etching at this time is just etching as shown in FIG. 10, like the etching of the Au film 2h. Thus, the Pd film 2k is etched so as to have the same size as each of the resist film 3 and the Au film 2h in planar view. The Pd film 2k as the interlayer is etched such that the edge of the Pd film 2k (as the interlayer) directly under the Au film 2h as the uppermost layer is located in the same position as the edge of the Au film 2h as the uppermost layer in planar view. That is, the Pd film 2k as the interlayer is etched so as to have the same size as that of the Au film 2h as the uppermost layer.

Then, the lowermost layer is etched in step S16 shown in FIG. 11. That is, a part of the Ti film 2m as the lowermost layer in the UBM 2n is removed by etching using the resist film 3 as a mask. The etching at this time is just etching, like the etching of the Pd film 2k. Thus, the Ti film 2m is etched so as to have the same size as each of the resist film 3, the Au film 2h, and the Pd film 2k in planar view. The Ti film 2m as the lowermost layer is etched such that the edge of the Ti film 2m as the lowermost layer is located in the same position as each of the edge of the Au film 2h as the uppermost layer, and the edge of the Pd film 2k as the interlayer in planar view. That is, the Ti film 2m as the lowermost layer is etched so as to have the same size as that of each of the Au film 2h as the uppermost layer and the Pd film 2k as the interlayer.

Then, the uppermost layer is re-etched in step S17. That is, the Au film 2h as the uppermost layer is re-etched using the resist film 3 as a mask, whereby a part of the Au film 2h is removed. At this time, the part of the Au film 2h located under the resist film 3 is removed through side etching by performing over-etching. That is, the Au film 2h as the uppermost layer is side-etched such that the edge of the Au film 2h as the uppermost layer is located inside the edge of the Pd film 2k (as the interlayer) located directly under the Au film in planar view. Thus, the Au film 2h is formed such that the edge of the Au film 2h as the uppermost layer is located inside the edge of the Pd film 2k as the interlayer in planar view of the UBM 2n.

In other words, the Au film 2h is formed such that the size of the Au film 2h as the uppermost layer is smaller than that of the Pd film 2k (as the interlayer) directly under the Au film in planar view of the UBM 2n formed over each of the electrode pads 2c.

The amount of side etching of the Au film 2h depends on the kind, or thickness of the metal, the pattern density, or the etchant. Also, in the example shown in FIG. 11, the amount of side etching is, for example, about 1 to 2 μm. An etchant (etching solution) used in re-etching the uppermost layer in step S17 is, for example, an iodine solution. The amount of etching the Au film 2h as the uppermost layer is adjusted by controlling the etching rate by an additive to the solution, the temperature of the solution, or the like.

After etching the Au film 2h as the uppermost layer into a desired size, the resist is removed in step S18. Here, the resist film 3 is removed and cleared.

As mentioned above, the formation of the three-layered UBM 2n over the electrode pad 2c of the silicon substrate 1 is completed.

Also, in formation of the UBM 2g in the modified example, after only one photolithography step, the Au film 2h as the uppermost layer, the Pd film 2k as the interlayer, and the Ti film 2m as the lowermost layer are etched by the respective predetermined amounts. Thereafter, the Au film 2h as the uppermost layer is re-etched (side-etched) by another predetermined amount. As a result, the Au film 2h as the uppermost layer can be formed to be smaller than the Pd film 2k (as the interlayer) directly under the Au film in planar view.

This arrangement can suppress the formation of a suspended part 55 of the Au film 2h as the uppermost layer represented by the part "A" in FIG. 20, and can prevent the occurrence of electrical short circuit between the adjacent pads due to the suspended part 55, while preventing adhesion of the suspended part 55 as foreign matter to the semiconductor substrate.

Accordingly, the UBM 2n can be formed by a simple process, for example, which can enhance the size/position accuracy compared with other processes involving two photolithography steps. As a result, this formation method is appropriate to the microfabrication, and thus is more effectively applied to the microfabrication.

That is, the modified examples as shown in FIGS. 9 to 11 can also obtain the same effects as those provided by the structures and UBM formation method shown in FIGS. 1 to 6.

Although in the first embodiment, the two-layered UBM 2g includes the Au film 2h as the upper layer and the TiW film 2i as the lower layer by way of example, the UBM 2g may include an Au film 2h as the upper layer and a Ni film as the lower layer, or the like.

Although the three-layered UBM 2n includes the Au film 2h as the uppermost layer, the Pd film 2k as the interlayer, and the Ti film 2m as the lowermost layer by way of example, the UBM 2n may include an Au film 2h as the uppermost layer, a Pd film 2k as the interlayer, and a Ni film as the lowermost layer, or the like. Alternatively, the UBM 2n may include an Au film 2h as the uppermost layer, a Cu film as the interlayer, and a Ti film 2m as the lowermost layer, or the like.

Second Embodiment

Figure 12:
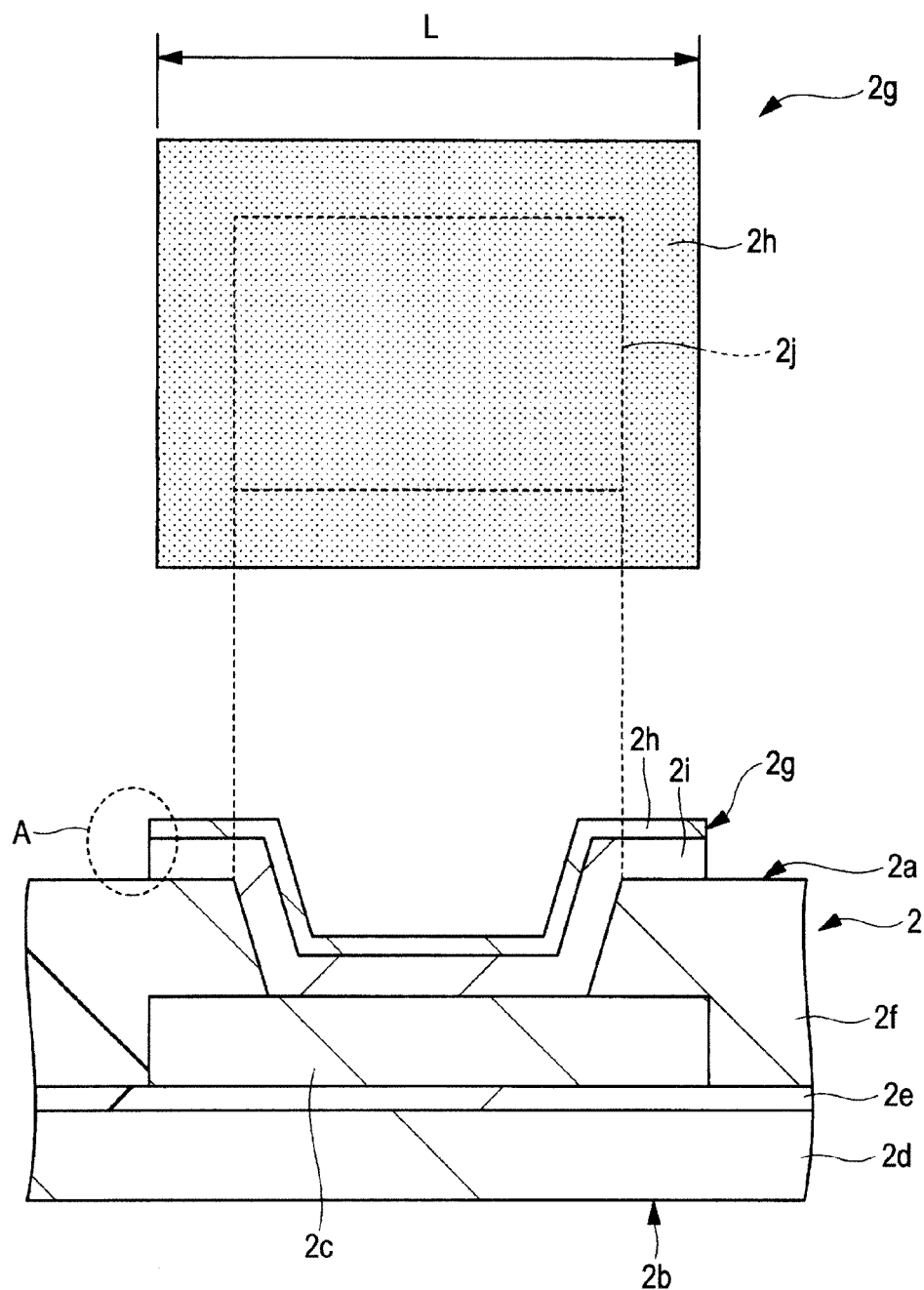
FIG. 12 shows a partial plan view and a partial cross-sectional view of an example of a pad structure in a semiconductor device of a second embodiment.

FIG. 12 shows a partial plan view and a partial cross-sectional view of an example of a pad structure in a semiconductor device of a second embodiment.

Like the semiconductor device of the first embodiment, in a semiconductor device of the second embodiment, the UBM (metal film) 2g serving as the underlayer metal for bonding the bump electrode is formed over each of the electrode pads (electrodes) 2c of the semiconductor chip 2 with the semiconductor integrated circuit. The semiconductor device of the second embodiment differs from the semiconductor chip 2 of the first embodiment in the following points. In the two-layered UBM 2g comprised of an Au film 2h as the upper layer and a TiW film 2i as the lower layer, and formed over each electrode pad 2c, the edge of the Au film 2h as the upper layer (uppermost layer) is located in the same position around the entire periphery thereof as the edge of the TiW film 2i (directly under the Au film) as the lower layer in planar view.

That is, the end of the Au film 2h as the upper layer is aligned, around the entire periphery thereof, with the end of the TiW film 2i as the lower layer (located in the same position as that represented by reference numeral "A" in FIG. 12) in planar view of the UBM 2g. That is, the size of the Au film 2h as the upper layer is the same as that of the TiW film 2i as the lower layer, and the end of the Au film 2h has the entire periphery thereof aligned with the end of the TiW film in planar view of the UBM 2g.

In this way, in the UBM 2g over the electrode pad 2c, the end of the Au film 2h as the upper layer is aligned with the end of the TiW film 2i as the lower layer, which can suppress the formation of the suspended part 55 in the upper layer 50a as shown in FIG. 20, like the first embodiment.

This arrangement can prevent the occurrence of electrical short circuit between the adjacent pads due to the suspended part 55, and can also prevent the adhesion of the suspended part 55 as foreign matter to the semiconductor substrate.

As a result, like the first embodiment, the quality and reliability of the semiconductor chip (semiconductor device) 2 can be improved.

Now, a formation method of the UBM 2g according to the second embodiment will be described using FIGS. 13 to 15.

Figure 13:
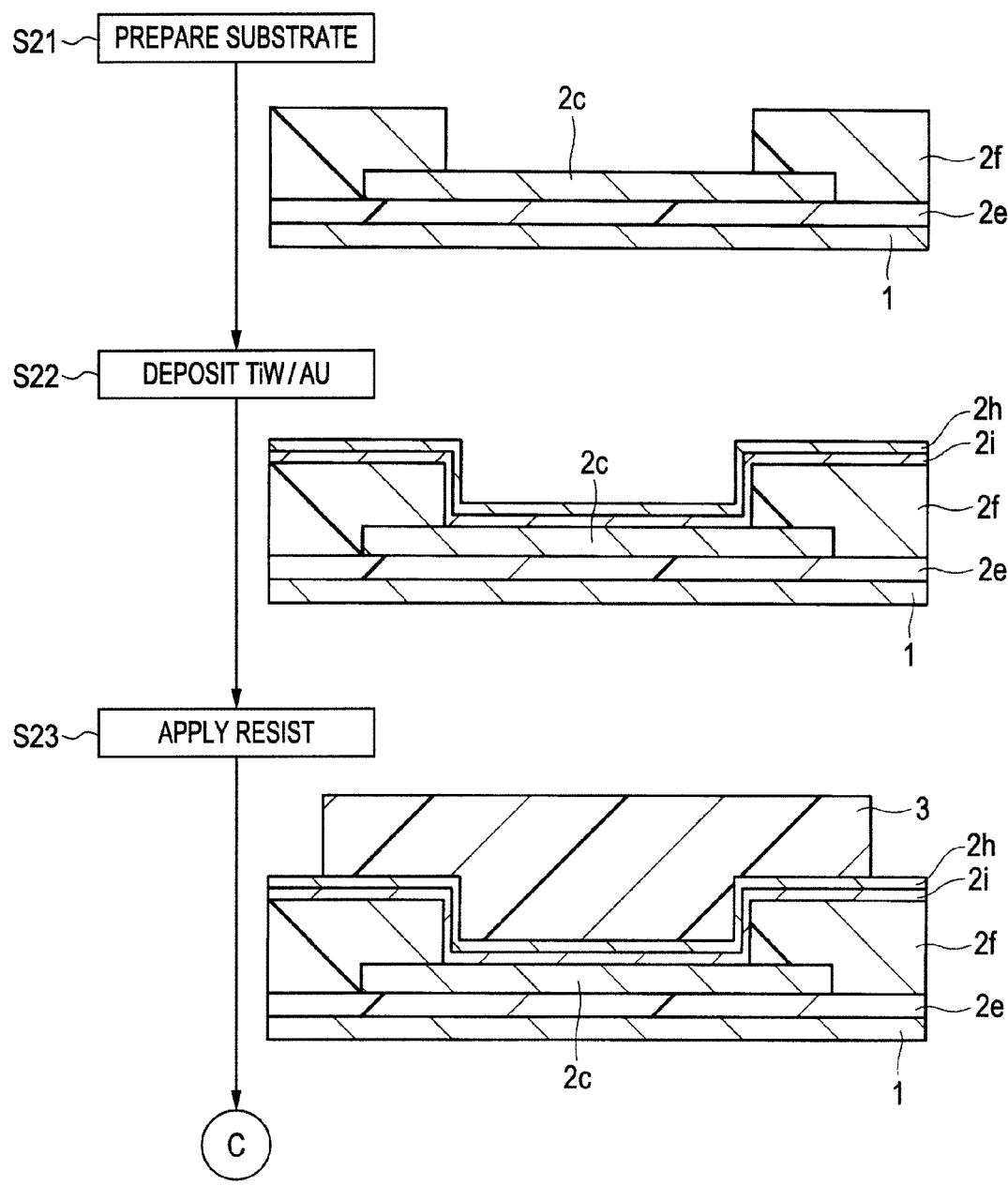
FIG. 13 is an enlarged partial cross-sectional view with a manufacturing process flow until application of a resist in formation of the UBM during assembly of the semiconductor device shown in FIG. 12.

FIG. 13 shows an enlarged partial cross-sectional view with a manufacturing process flow until application of a resist in formation of the UBM during assembly of the semiconductor device shown in FIG. 12. FIG. 14 is an enlarged partial cross-sectional view with a manufacturing process flow until etching of a lower layer in formation of the UBM during the assembly of the semiconductor device shown in FIG. 12. FIG. 15 is an enlarged partial cross-sectional view with a manufacturing process flow until removal of a resist in formation of the UBM during the assembly of the semiconductor device shown in FIG. 12.

Figure 14:
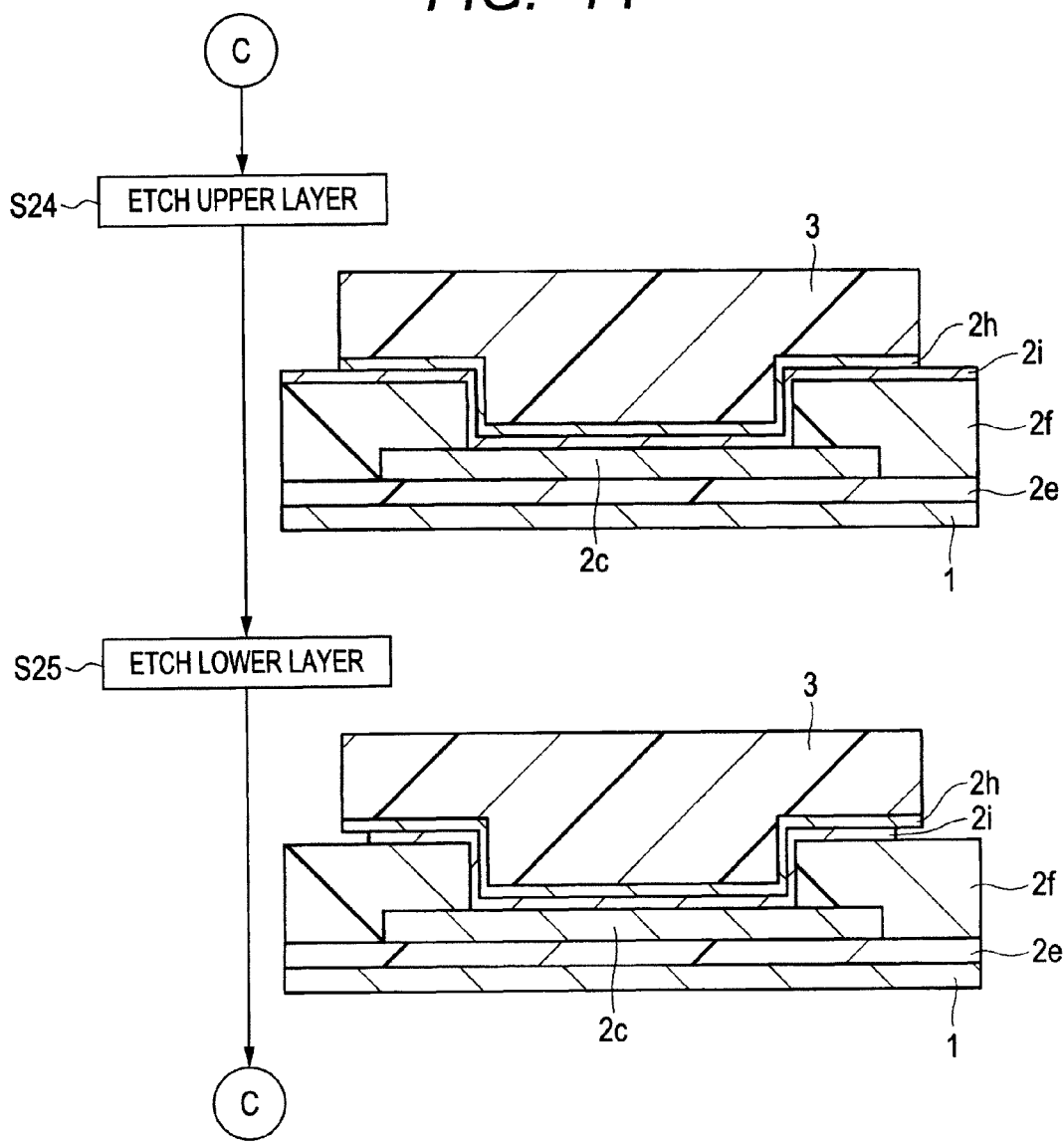
FIG. 14 is an enlarged partial cross-sectional view with a manufacturing process flow until etching of a lower layer in formation of the UBM during the assembly of the semiconductor device shown in FIG. 12.
Figure 15:
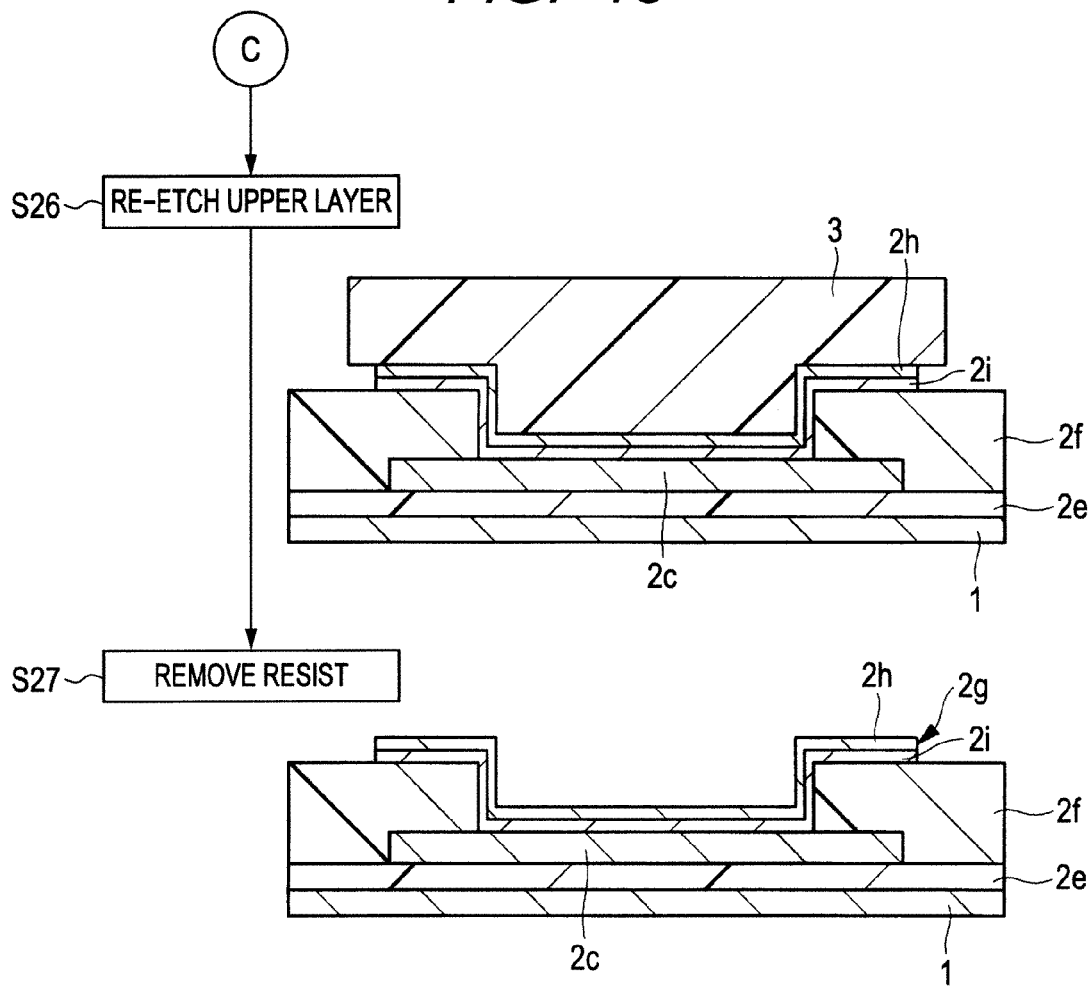
FIG. 15 is an enlarged partial cross-sectional view with a manufacturing process flow until removal of a resist information of the UBM during the assembly of the semiconductor device shown in FIG. 12.

FIGS. 13 to 15 also illustrate the formation of the UBM over an electrode pad in the form of wafer. First, as represented by step S21 in FIG. 13, a silicon substrate 1 which is a semiconductor substrate with the electrode pads (electrodes) 2c formed thereover is prepared. The electrode pad 2c is formed in the wiring layer over the silicon substrate 1 via the insulating film 2e, and is, for example, an aluminum electrode pad comprised of aluminum.

Then, TiW/Au is deposited in step S22. The UBM 2g comprised of a multilayer (two-layered) metal film is formed over each of the electrode pads 2c as shown in FIG. 15. The upper layer (uppermost layer) of the UBM 2g is, for example, an Au film (first metal film) 2h, and the lower layer is, for example, a TiW film (second metal film) 2i.

The function and thickness of each of the Au film 2h as the upper layer and the TiW film 2i as the lower layer are the same as those in the first embodiment. The etchant (etching solution), the control method of an etching rate, the amount of side etching, and the like used for etching the respective films are the same as those of the first embodiment, and a repeated description thereof will be omitted below. The same goes for the dry etching.

Thereafter, a resist is applied in step S23, so that a resist film 3 is formed over the Au film 2h. At this time, the resist film 3 is formed such that a part for side etching of the UBM 2g is oversize with respect to the designed value. Specifically, the resist film 3 is formed in such a size that is larger around the entire periphery thereof than that of a finally formed part of the Au film 2h as the upper layer in planar view.

Then, the upper layer is etched in step S24 shown in FIG. 14. That is, a part of the Au film 2h as the upper layer (uppermost layer) in the UBM (two-layered metal film) 2g is removed by etching using the resist film 3 as a mask. The etching at this time is the just etching as shown in FIG. 14. Thus, the Au film 2h is etched so as to have the same size as the resist film 3 in planar view.

Then, the lower layer is etched in step S25. That is, a part of the TiW film 2i (as the lower layer) directly under the Au film 2h as the upper layer (uppermost layer) in the UBM 2g is removed by etching using the resist film 3 as a mask. At this time, the part of the TiW film 2i located under the resist film 3 and the Au film 2h is removed through side etching by performing over-etching. That is, the TiW film 2i is side-etched such that the edge of the TiW film 2i (as the lower layer) directly under the Au film 2h is located inside the edge of the Au film 2h as the upper layer (uppermost layer) in planar view.

Thereafter, the upper layer is re-etched in step S26 as shown in FIG. 15. The Au film 2h as the upper layer is etched such that the edge of the Au film 2h as the upper layer is aligned with the edge of the TiW film 2i as the lower layer by side-etching the Au film 2h as the upper layer. That is, the end of the Au film 2h as the upper layer is aligned with the end of the TiW film 2i as the lower layer.

In other words, as shown in FIG. 12, the Au film 2h as the upper layer is re-etched (side-etched) such that the Au film 2h as the upper layer has the same size as the TiW film 2i as the lower layer.

After etching the Au film 2h into a desired size, the resist is removed in step S27 as shown in FIG. 15. The resist film 3 is removed and cleared.

As mentioned above, the formation of the two-layered UBM 2g over the electrode pad 2c located over the silicon substrate 1 is completed.

In the formation method of the UBM 2g of the second embodiment, one-time photolithography is performed and the etching rate is controlled. Accordingly, the UBM 2g can be formed by a simple process, for example, which can enhance the size/position accuracy with respect to other processes involving two photolithography steps. As a result, the formation method of the UBM 2g of the second embodiment is appropriate to the microfabrication, and is more effectively applied to the microfabrication.

Figure 16:
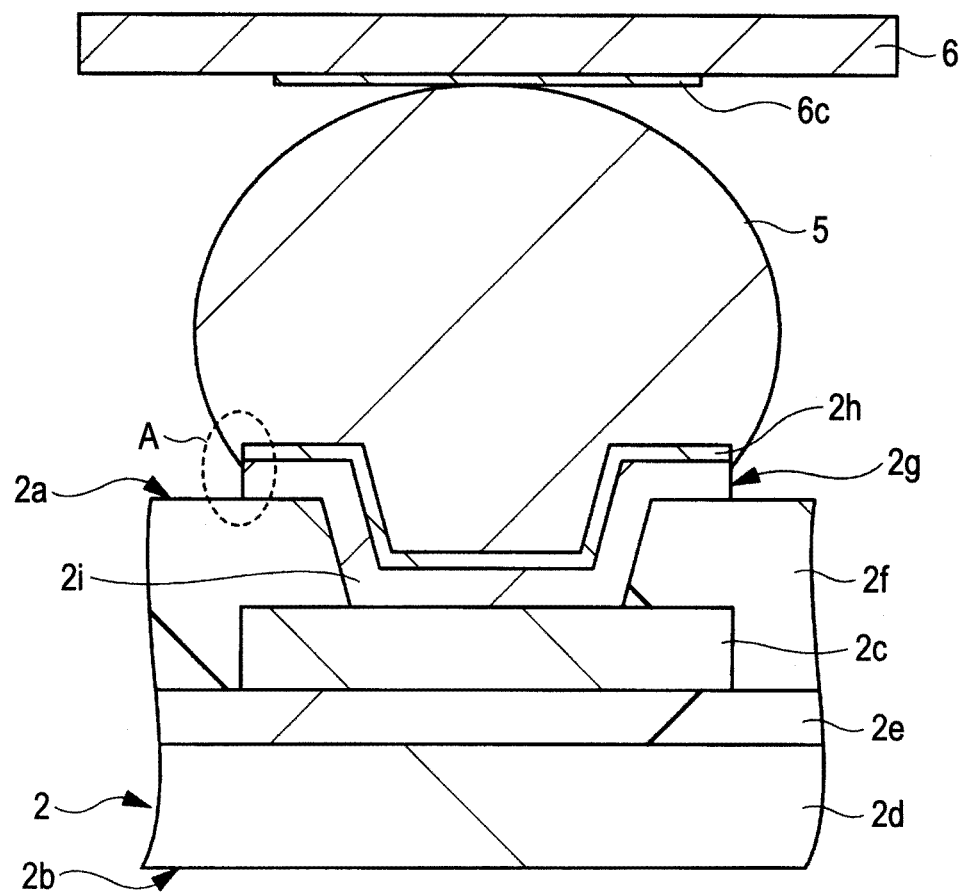
FIG. 16 is an enlarged partial cross-sectional view showing an example of a mounting structure of the semiconductor device using a solder bump shown in FIG. 12.

FIG. 16 shows an enlarged partial cross-sectional view of an example of a mounting structure using a solder bump of the semiconductor device shown in FIG. 12.

That is, FIG. 16 shows the mounting structure of the semiconductor chip 2 with the UBM 2g formed thereover via the solder bump 5 in the second embodiment. The semiconductor chip 2 is mounted over the organic substrate 6 via the solder bumps 5. Also, the structure shown in FIG. 16 cannot effectively suppress the transverse expansion of the solder bump 5 at the time of fusion as compared to the mounting structure of the first embodiment shown in FIG. 8, but can also slightly suppress the formation of the suspended part 55 shown in FIG. 20. The mounting structure can provide the pads with a small pitch.

According to the manufacturing method and mounting structure of the semiconductor device (semiconductor chip 2) of the second embodiment, in the UBM 2g formed over the electrode pad 2c located over the semiconductor substrate, the edge of the Au film 2h as the upper layer is located in the same position as the edge of the TiW film 2i as the lower layer directly under the Au film (that is, the ends of both films are aligned with each other). Thus, the formation of the suspended part 55 as shown in FIG. 20 can be suppressed in the Au film 2h.

This arrangement can prevent the occurrence of the electrical short circuit between the adjacent pads due to the suspended part 55, and can also prevent the adhesion of the suspended part 55 as foreign matter to the semiconductor substrate.

As a result, like the first embodiment, the quality and reliability of the semiconductor device (semiconductor chip 2) can be improved.

Other effects given by the manufacturing method and mounting structure of the semiconductor device (semiconductor chip 2) in the second embodiment are the same as those in the first embodiment, and thus a repeated description thereof will be omitted below.

Now, a modified example of the second embodiment will be described below.

Figure 17:
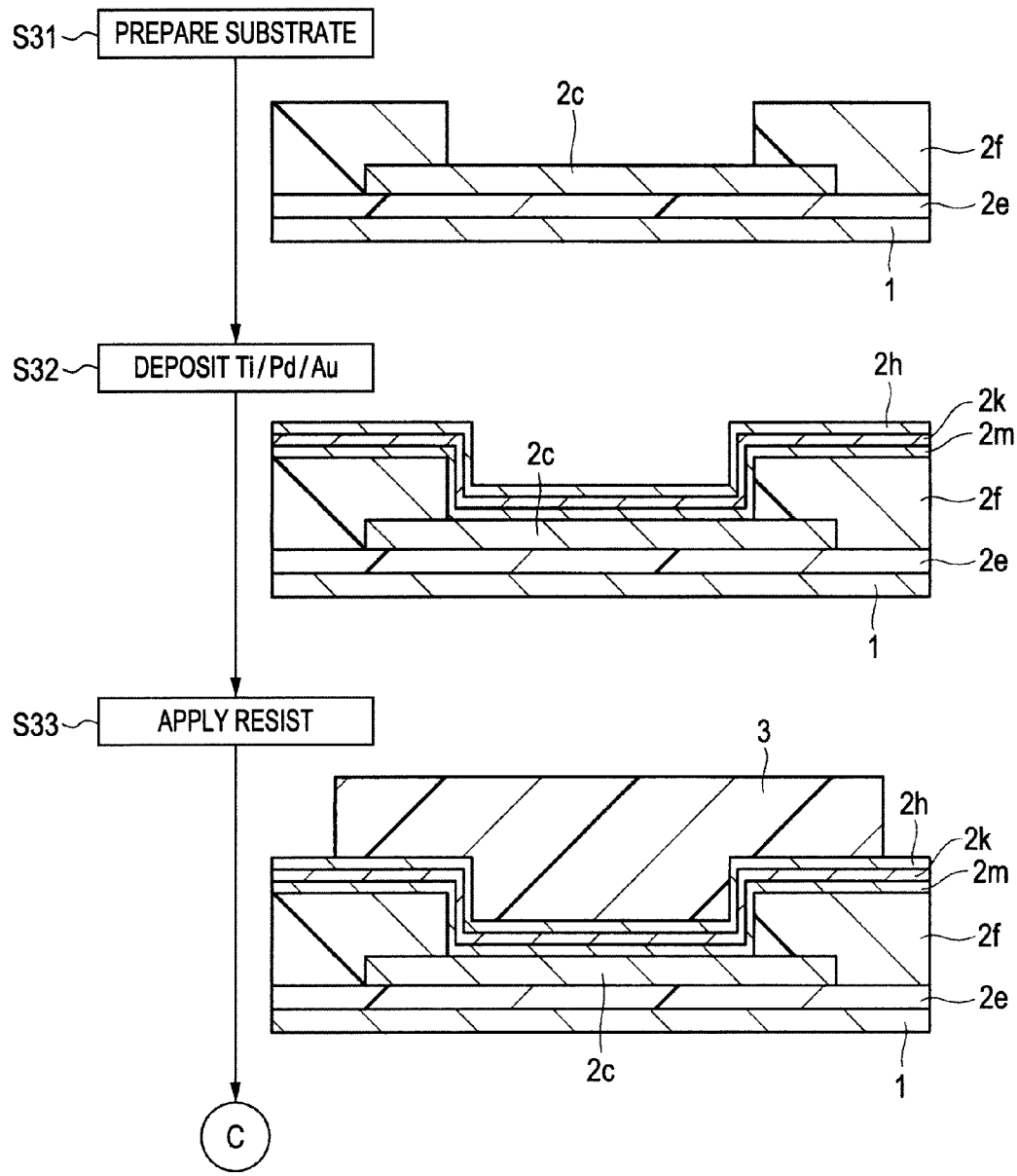
FIG. 17 is an enlarged partial cross-sectional view with a manufacturing process flow until application of a resist in formation of the UBM during the assembly of a semiconductor device in the modified example of the second embodiment.
Figure 18:
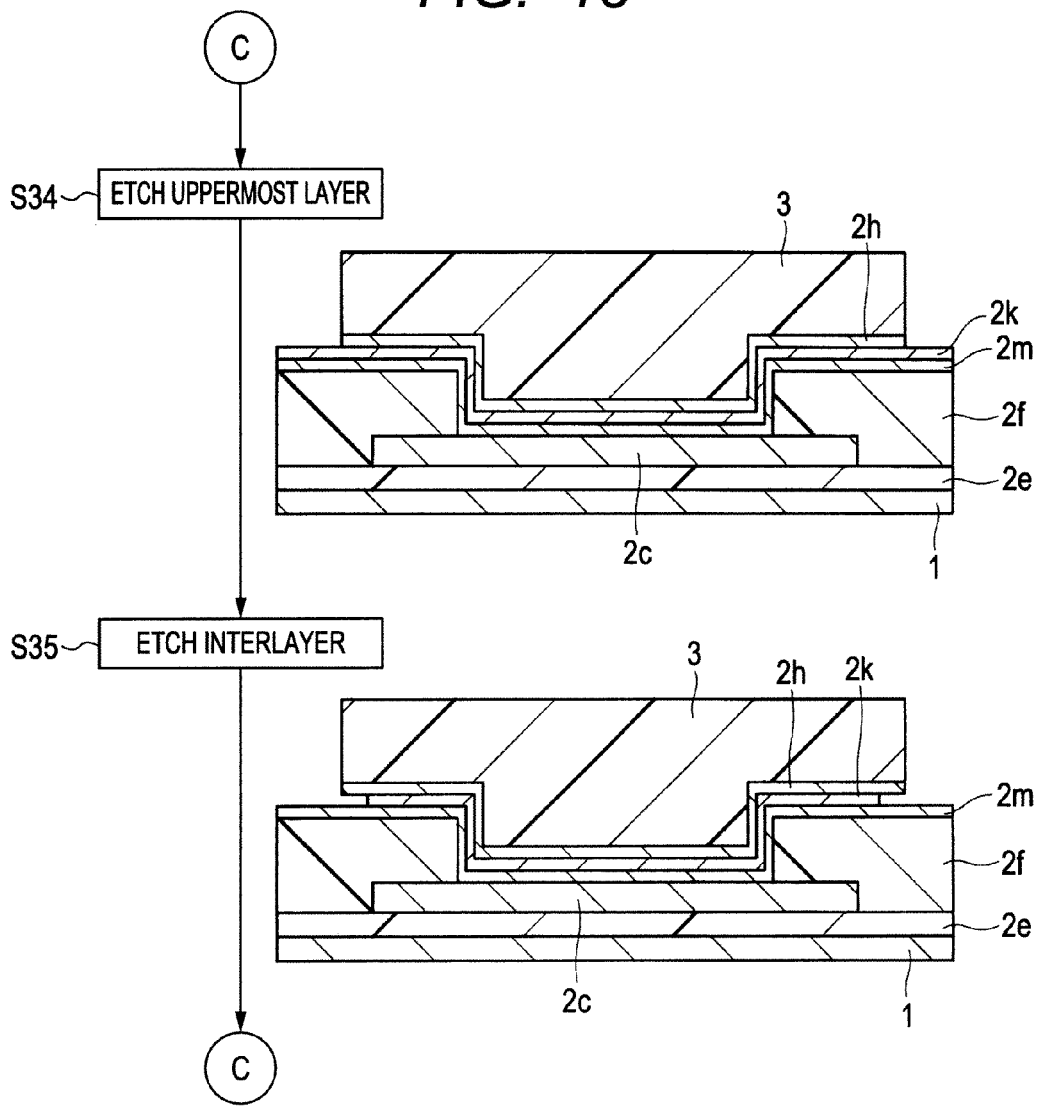
FIG. 18 is an enlarged partial cross-sectional view with a manufacturing process flow until etching of an interlayer in formation of the UBM during the assembly of a semiconductor device in a modified example of the second embodiment.
Figure 19:
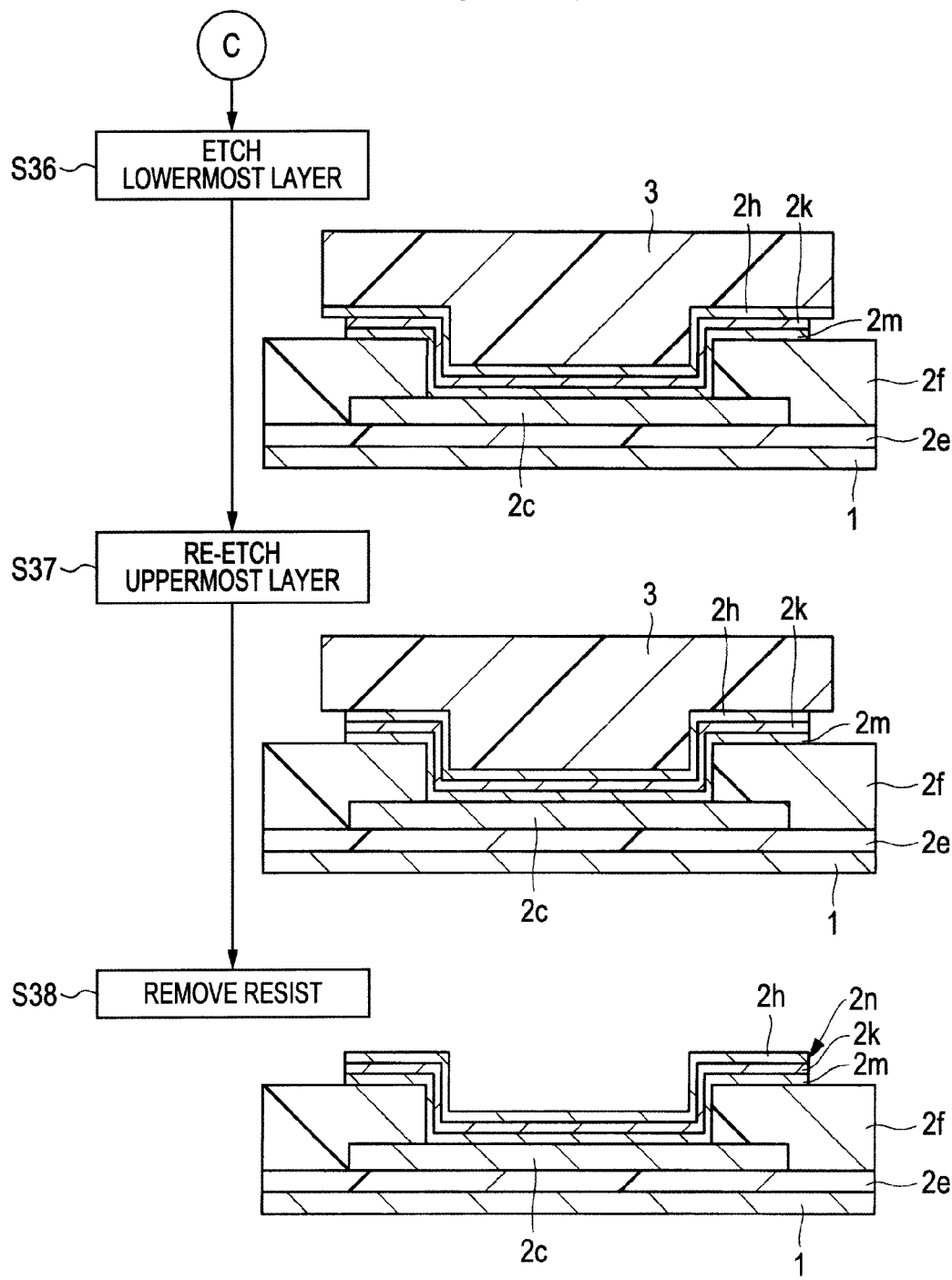
FIG. 19 is an enlarged partial cross-sectional view with a manufacturing process flow until removal of a resist information of the UBM during the assembly of the semiconductor device in the modified example of the second embodiment.

FIG. 17 is an enlarged partial cross-sectional view with a manufacturing process flow until application of a resist in formation of the UBM during the assembly of a semiconductor device in the modified example of the second embodiment. FIG. 18 is an enlarged partial cross-sectional view with a manufacturing process flow until etching of an interlayer in formation of the UBM during the assembly of the semiconductor device in the modified example of the second embodiment. FIG. 19 is an enlarged partial cross-sectional view with a manufacturing process flow until removal of the resist in formation of the UBM during the assembly of the semiconductor device in the modified example of the second embodiment.

FIGS. 17 to 19 show a formation procedure of a UBM 2n in the modified example. The UBM 2n is a three-layered metal film. In the example, the ends of three layers of the metal film are aligned with each other.

Like the UBM 2n of the first embodiment, the three-layered UBM 2n as shown in FIG. 19 has a first metal film comprised of an Au film 2h as the uppermost layer, a second metal film comprised of a Pd film 2k as a layer directly under the first metal film (as an interlayer), and a third metal film comprised of a Ti film 2m as the lowermost layer as will be described by way of example later.

First, as represented by step S31 in FIG. 17, a silicon substrate 1 which is a semiconductor substrate with electrode pads (electrodes) 2c formed thereover is prepared. The electrode pad 2c is formed in the wiring layer over the silicon substrate 1 via the insulating film 2e. The electrode pad 2c is, for example, an aluminum electrode pad comprised of aluminum.

Then, Ti/Pd/Au is deposited in step S32. The UBM 2n comprised of a multilayer (three-layered) metal film is formed over each of the electrode pads 2c as shown in FIG. 19. The upper layer (uppermost layer) of the UBM 2n is an Au film (first metal film) 2h. The second metal film directly under the first film (interlayer) is a Pd film 2k. The third metal film as the lower layer (lowermost layer) is a Ti film 2m.

The Au film 2h as the uppermost layer is made of metal for enhancing conductivity and bonding stability with the bump electrode. The Pd film 2k as the interlayer is made of barrier metal for preventing the diffusion of metal and the formation of compounds of the uppermost layer/interlayer. The Ti film 2m as the lowermost layer is made of barrier metal for preventing the diffusion of metal and the formation of compounds of the uppermost layer/interlayer.

Then, a resist is applied in step S33, so that a resist film 3 is formed over the Au film 2h. At this time, the resist film 3 is formed such that a part for side etching of the UBM 2n is oversize with respect to the designed value. Specifically, the resist film 3 is formed in such a size that is larger around the entire periphery thereof than that of a finally formed part of the Au film 2h as the uppermost layer in planar view.

Thereafter, the uppermost layer is etched in step S34 as shown in FIG. 18. That is, a part of the Au film 2h as the uppermost layer in the UBM (three-layered metal film) 2n shown in FIG. 19 is removed by etching using the resist film 3 as a mask. The etching at this time is the just etching. Thus, the Au film 2h is etched so as to have the same size as the resist film 3 in planar view. The etchant (etching solution) used for etching the Au film 2h is, for example, an iodine solution. When possible, the dry etching may be performed.

Thereafter, the interlayer is etched in step S35. That is, a part of the Pd film 2k (as the interlayer) directly under the Au film 2h as the uppermost layer in the UBM 2n is removed by etching using the resist film 3 as a mask. At this time, over etching is performed from under the Au film 2h as the uppermost layer through side etching. That is, the part of the Pd film 2k under the Au film 2h is removed. Specifically, the Pd film 2k as the interlayer is side-etched such that the edge of the Pd film 2k as the interlayer is located inside the edge of the Au film 2h as the uppermost layer in planar view.

In other words, the Pd film 2k is etched such that the Pd film 2k as the interlayer is smaller than the Au film 2h as the uppermost layer in planar view of the Pd film 2k of the interlayer.

The amount of side etching of the Pd film 2k depends on the kind, or thickness of the metal, the pattern density, or the etchant. Also, in the example shown in FIG. 18, the amount of side etching is, for example, about 1 to 2 μm.

Then, the lowermost layer is etched in step S36 as shown in FIG. 19. That is, a part of the Ti film 2m as the lowermost layer in the UBM 2n is removed by etching using the resist film 3 as a mask. At the time of etching, the over etching is also performed from under the Au film 2h as the uppermost layer through side etching to thus cause the end of the Ti film 2m to be aligned with the end of the Pd film 2k as the interlayer, like the Pd film 2k as the interlayer. That is, the Ti film 2m as the lowermost layer is side-etched such that the end of the Ti film 2m is aligned with the end of the Pd film 2k as the interlayer.

Then, the uppermost layer is re-etched in step S37. The Au film 2h as the uppermost layer is etched such that the edge of the Au film 2h as the uppermost layer is aligned with the edge of the Pd film 2k as the interlayer and the edge of the Ti film 2m as the lowermost layer by the side etching of the Au film 2h. That is, the end of the Au film 2h as the uppermost layer is aligned with the end of the of the Pd film 2k as the interlayer, and the Ti film 2m as the lowermost layer.

In other words, the Au film 2h as the uppermost layer is re-etched (side-etched) such that the Au film 2h as the uppermost layer has the same size as each of the Pd film 2k as the interlayer and the Ti film 2m as the lowermost layer.

After etching the Au film 2h into a desired size, the resist is removed in step S38 shown in FIG. 19. At this time, the resist film 3 is removed and cleared.

As described above, the formation of the three-layered UBM 2g over the electrode pad 2c located over the silicon substrate 1 is completed.

In this way, also in formation of the UBM 2n in the modified example of the second embodiment, after only one photolithography step, the Au film 2h as the uppermost layer, the Pd film 2k as the interlayer, and the Ti film 2m as the lowermost layer are etched by the respective predetermined amounts. Then, the Au film 2h as the uppermost layer is re-etched (side-etched), so that the end of the Au film 2h as the uppermost layer can be aligned with the end of each of the Pd film 2k as the interlayer and the Ti film 2m as the lowermost layer in planar view of the UBM 2n.

Thus, this arrangement can suppress the formation of the suspended part 55 in the "A" part of the Au film 2h as the uppermost layer as shown in FIG. 20, and can prevent the occurrence of electrical short circuit between the adjacent pads due to the suspended part 55, while preventing the adhesion of the suspended part 55 as foreign matter to the semiconductor substrate.

Accordingly, the UBM 2n can be formed by a simple process, for example, which can enhance the size/position accuracy with respect to other processes involving two photolithography steps. As a result, this formation method is appropriate to the microfabrication, and thus is more effectively applied to the microfabrication.

That is, the modified example shown in FIGS. 17 to 19 can also obtain the same effects as those obtained by the structure and the formation method of the UBM shown in FIGS. 13 to 15.

The invention made by the inventors has been specifically described based on the preferred embodiments, but is not limited to the embodiments disclosed therein. It is apparent that various changes and modifications can be made to the embodiments without departing from the spirit and scope of the invention.

Although the UBM is comprised of, for example, the two- or three-layered metal film in the first and second embodiments, the UBM may be comprised of a four-layered metal film. The four-layered metal film is comprised of, by way of example, a Ti film as a lowermost metal film, a Cu film as a second metal film from the bottom thereof, a Ni film as a third metal film from the bottom thereof, and an Au film as an uppermost metal film.

Although in the first and second embodiments, the kind of metal for forming the electrode pad (wiring layer) under the UBM is aluminum (Al), suitable kinds of the metal may include, for example, an Al compound, Cu, and the like. Suitable Al compounds include, for example, Al—Si, Al—Si—Cu, Al—Cu, and the like.

In the mounting structure (module) of the semiconductor chip (semiconductor device) described in the first and second embodiments, the bump electrode is mounted over the substrate after being formed over the UBM. However, the bump electrode may be formed at an object of interest for mounting (substrate or the like) without being formed over the UBM to be thereby applied to bonding for contact conduction (resin seal).

The present invention is suitably applied to electronic devices with the UBM where bump bonding is performed.

What is claimed is:

1. A manufacturing method of a semiconductor device, comprising the steps of:
   (a) preparing a semiconductor substrate with a plurality of electrodes formed thereover;
   (b) forming a multilayer metal film over each of the electrodes;
   (c) forming a resist film over the multilayer metal film;
   (d) removing a part of a first metal film as an uppermost layer of the multilayer metal film by etching using the resist film as a mask;
   (e) removing a part of a second metal film located directly under the first metal film as the uppermost layer of the multilayer metal film by etching using the resist film as the mask;
   (f) removing another part of the first metal film as the uppermost layer by re-etching using the resist film as the mask; and
   (g) removing the resist film,
   wherein an edge of the first metal film as the uppermost layer is located inside or in the same position as an edge of the second metal film directly under the first metal film in planar view of the multilayer metal film formed over each of the electrodes.

2. The manufacturing method of a semiconductor device according to claim 1, wherein a size of the first metal film as the uppermost layer is smaller than that of the second metal film directly under the first metal in planar view of the multilayer metal film formed over each of the electrodes.

3. The manufacturing method of a semiconductor device according to claim 2, wherein the first metal film as the uppermost layer of the multilayer metal film is an Au film.

4. The manufacturing method of a semiconductor device according to claim 3, wherein in the step (e), the second metal film directly under the first metal film as the uppermost layer is etched such that the edge of the second metal film is located in the same position as the edge of the first metal film as the uppermost layer in planar view, and
   wherein in the step (f), the first metal film as the uppermost layer is etched such that the edge of the first metal film as the uppermost layer is located inside the edge of the second metal film directly under the first metal film in planar view, whereby the edge of the first metal film as the uppermost layer is located inside the edge of the second metal film directly under the first metal film in planar view of the multilayer metal film.

5. The manufacturing method of a semiconductor device according to claim 3, wherein in the step (e), the second metal film directly under the first metal film as the uppermost layer is etched such that the edge of the second metal film is located inside the edge of the first metal film as the uppermost layer in planar view, and thereafter, in the step (f), the first metal film as the uppermost layer is etched such that the edge of the first metal film as the uppermost layer is located in the same position as the edge of the second metal film directly under the first metal film in planar view, and the edge of the first metal film as the uppermost layer is located in the same position as the edge of the second metal film directly under the first metal film in planar view of the multilayer metal film.

6. The manufacturing method of a semiconductor device according to claim 1, wherein in the step (f), an amount of etching of the first metal film as the uppermost layer is adjusted by controlling an etching rate.

7. The manufacturing method of a semiconductor device according to claim 1, wherein in the step (c), the resist film is formed in such a size that is larger around an entire periphery thereof than that of the first metal film as the uppermost layer to be formed in the step (f) in planar view.

8. The manufacturing method of a semiconductor device according to claim 1, wherein after the step (g), the semiconductor substrate is cut into a plurality of semiconductor chips.

9. The manufacturing method of a semiconductor device according to claim 8, wherein gold bumps are coupled to the respective electrodes of the semiconductor chips.

10. The manufacturing method of a semiconductor device according to claim 8, wherein solder bumps are coupled to the respective electrodes of the semiconductor chips.

* * * * *